(12) United States Patent
Lane et al.

(10) Patent No.: US 8,351,285 B2
(45) Date of Patent: Jan. 8, 2013

(54) SYSTEMS, MEMORIES, AND METHODS FOR REPAIR IN OPEN DIGIT MEMORY ARCHITECTURES

(75) Inventors: Michael S. Lane, Boise, ID (US);
Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 684 days.

(21) Appl. No.: 12/497,192

(22) Filed: Jul. 2, 2009

(65) Prior Publication Data

US 2011/0002152 A1  Jan. 6, 2011

(51) Int. Cl.
*G11C 7/14* (2006.01)
*G11C 7/06* (2006.01)

(52) U.S. Cl. .......... 365/200; 365/51; 365/149; 365/190; 365/208; 365/210.1; 365/63

(58) Field of Classification Search ............. 365/51, 365/149, 190, 208, 210.1, 200, 63
See application file for complete search history.

(56) References Cited

U.S. PATENT DOCUMENTS

| | | | | |
|---|---|---|---|---|
| 5,383,159 | A * | 1/1995 | Kubota | 365/207 |
| 5,396,450 | A * | 3/1995 | Takashima et al. | 365/51 |
| 5,555,203 | A * | 9/1996 | Shiratake et al. | 365/51 |
| 5,555,519 | A * | 9/1996 | Takashima et al. | 365/63 |
| 5,732,010 | A * | 3/1998 | Takashima et al. | 365/63 |
| 5,838,038 | A * | 11/1998 | Takashima et al. | 257/301 |
| 6,243,311 | B1 | 6/2001 | Keeth | |
| 6,370,054 | B1 * | 4/2002 | Fujisawa et al. | 365/63 |
| 6,373,776 | B2 * | 4/2002 | Fujisawa et al. | 365/230.03 |
| 6,498,756 | B2 | 12/2002 | Lee | |
| 6,504,769 | B2 | 1/2003 | Do et al. | |
| 6,577,544 | B2 | 6/2003 | Horiguchi et al. | |
| 6,754,114 | B2 | 6/2004 | Horiguchi et al. | |
| 6,762,949 | B2 * | 7/2004 | Fujisawa et al. | 365/63 |
| 6,816,425 | B2 | 11/2004 | Graham et al. | |
| 7,027,339 | B2 | 4/2006 | Shin et al. | |
| 7,106,643 | B2 | 9/2006 | Horiguchi et al. | |
| 7,221,576 | B2 * | 5/2007 | Fujisawa et al. | 365/63 |
| 7,349,232 | B2 | 3/2008 | Wang et al. | |

(Continued)

OTHER PUBLICATIONS

Horiguchi et al., A Flexible Redundancy Technique for High-Density DRAM's, IEEE Journal of Solid-State Circuits, vol. 26, No. 1, Jan. 1991, pp. 12-17.

(Continued)

*Primary Examiner* — Hoai V Ho
*Assistant Examiner* — Jay Radke
(74) *Attorney, Agent, or Firm* — TraskBritt

(57) ABSTRACT

Memories, systems, and methods for repairing are provided. A memory with extra digit lines in end arrays with an open digit architecture, which can use the extra digit lines to form repair cells. In one example, folded digit sense amplifiers are connected to an end array with an open digit architecture such that each sense amplifier corresponds to a group of four adjacent digit lines. Two digit lines of the group connect to two open digit sense amplifiers and the other two digit lines connect to the corresponding folded digit sense amplifier. To repair memories including folded digit end arrays, a row in a core array that includes a replaceable IO is activated and a row in an end array is activated. The repair cells in the end array can be sensed by the folded digit sense amplifiers to generate a replacement IO, which is selected rather than the replaceable IO.

29 Claims, 17 Drawing Sheets

U.S. PATENT DOCUMENTS

| | | |
|---|---|---|
| 7,467,334 B2 | 12/2008 | Blodgett |
| 7,474,550 B2 * | 1/2009 | Fujisawa et al. ............... 365/63 |
| 2003/0112695 A1 * | 6/2003 | Fujisawa et al. ......... 365/230.03 |
| 2003/0151943 A1 * | 8/2003 | Sadakata ...................... 365/149 |
| 2007/0041260 A1 * | 2/2007 | Hong et al. ................... 365/208 |
| 2007/0081375 A1 * | 4/2007 | Kawakita et al. ............... 365/63 |
| 2007/0115711 A1 | 5/2007 | Shore et al. |
| 2007/0195573 A1 * | 8/2007 | Fujisawa et al. ............... 365/63 |
| 2008/0011224 A1 | 1/2008 | Iwai et al. |
| 2008/0056039 A1 * | 3/2008 | Kim et al. ..................... 365/205 |
| 2008/0112240 A1 | 5/2008 | Han |
| 2008/0151664 A1 * | 6/2008 | Kim et al. ..................... 365/205 |
| 2010/0290296 A1 * | 11/2010 | Lee ............................... 365/200 |
| 2010/0290297 A1 * | 11/2010 | Kyung ......................... 365/200 |

OTHER PUBLICATIONS

Lee et al., A New Column Redundancy Scheme for Yield Improvement of High Speed DRAMs with Multiple Bit Pre-fetch Structure, 2001 Symposium on VLSI Circuits Digest of Technical Papers, pp. 69-70.

Lee et al., I/O Divided Column Redundancy Scheme for High-Speed DRAM with Multiple I/Os, Electronics Letters, Nov. 23, 2000, vol. 36, No. 24, pp. 1996-1997.

Takahashi et al., A Multigigabit DRAM Technology with 6F2 Open-Bitline Cell, Distributed Overdriven Sensing, and Stacked-Flash Fuse, IEEE Journal of Solid-State Circuits, vol. 36, No. 11, Nov. 2001, 1721-1727.

\* cited by examiner

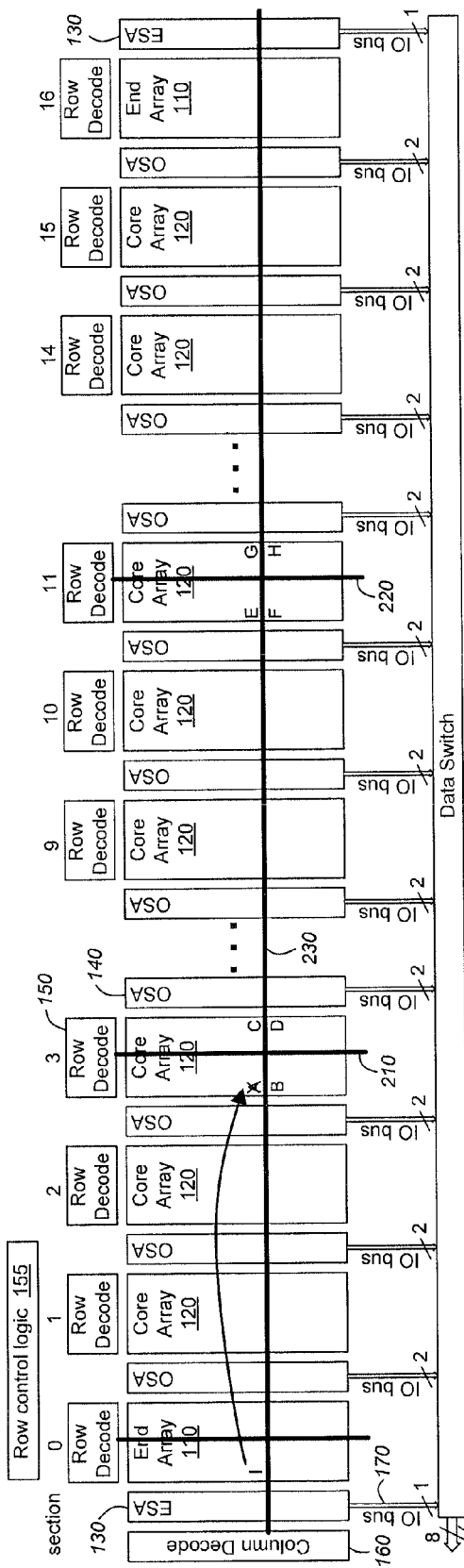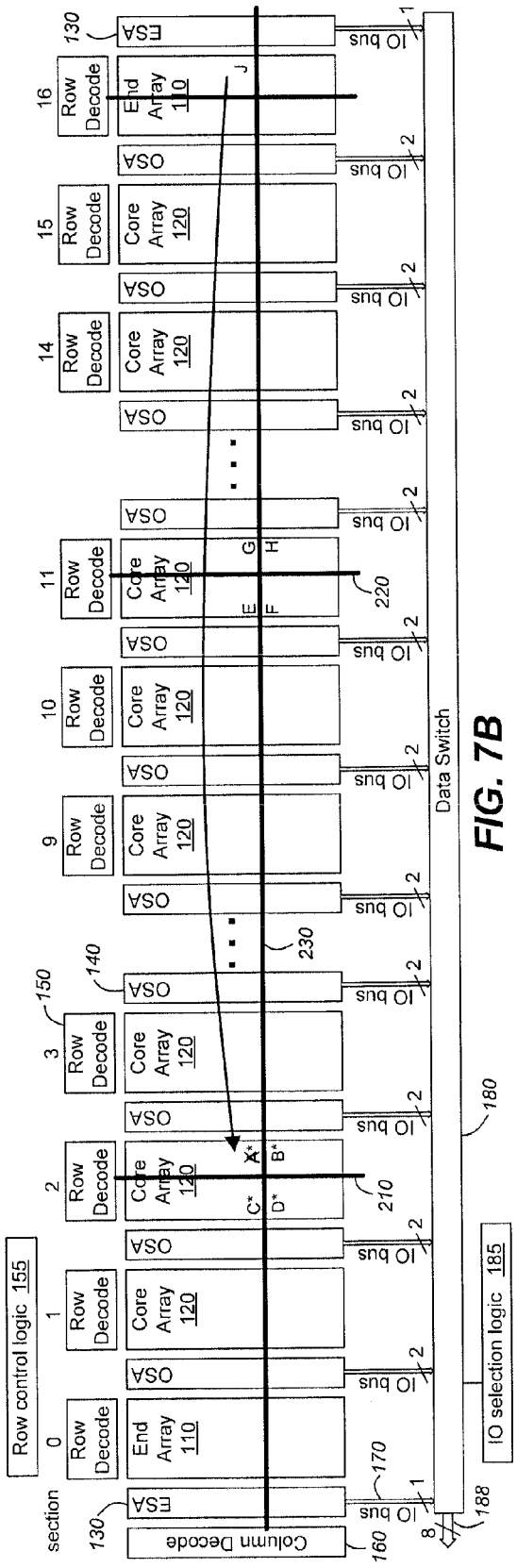

SYSTEMS, MEMORIES, AND METHODS FOR REPAIR IN OPEN DIGIT MEMORY ARCHITECTURES

FIELD OF THE INVENTION

Embodiments of the present invention relate to semiconductor devices and, more particularly, to repairing semiconductor memories.

BACKGROUND

A Dynamic Random Access Memory (DRAM) has memory arrays consisting of a number of memory cells. In a conventional DRAM each memory cell (sometimes referred to as a memory bit) consists of one transistor and one capacitor. A terminal of the transistor is connected to a digit line (sometimes referred to as a bit line) of the memory device. Another terminal of the transistor is connected to a terminal of the capacitor and the gate terminal of the transistor is connected to an access line (sometimes referred to as a word line) of the memory device. The transistor thus acts as a gate between the digit line and the capacitor. A second terminal of the capacitor is connected to a voltage rail which carries a voltage, such as VCC/2. Thus, when the word line for a particular cell is active, the gate transistor is in a conducting state and the capacitor is connected to the digit line. The capacitor stores a charge that, depending on whether the polarity of the voltage across the capacitor is positive or negative, represents either a logic high or a logic low value.

Typically, particular word and column select lines are activated to access selected memory cells. "Access" typically refers to reading data from or writing data to selected memory cells. Reading data from the memory cells typically involves the use of a sense circuit, such as an amplifier, to detect whether the voltage level stored in the memory cell represents a binary one or a binary zero.

At least two different types of DRAM arrays are currently used; a folded digit line architectures and an open digit line architectures. FIG. 1 is a simplified circuit diagram of a folded digit line architecture. Memory cells include an access transistor 10 coupled to a storage capacitor 12. The gates of the access transistors 10 are coupled to word lines 16. Sense amplifier circuits are placed at the edge of each array and connect to both true digit lines 14 and complement digit lines 18 coming from a single array. The memory cells are accessed by activating the proper word lines 16. For read cycles, the sense amplifier then senses a difference in voltage between the digit line pair (14, 18) to determine a programmed value for the cell.

FIG. 2 is a simplified circuit diagram of a conventional open digit line architecture. Memory cells include an access transistor 10 coupled to a storage capacitor 12. The gates of the access transistors 10 are coupled to word lines 16. In an open digit line architecture, the digit line pairs (14, 18) are in opposing memory arrays and the sense amplifiers are positioned between the digit line pairs (14, 18). Thus, the true digit line 14 is on one side of a sense amplifier and the complement digit line 18 is on the other side of a sense amplifier. In contrast, digit line pairs (14, 18) in a folded digit line architecture (FIG. 1) are formed side by side in the same array. As a result, a sense amplifier for sensing a digit line pair is formed on one side of the digit line pair.

Each architecture has its advantages and disadvantages. One disadvantage of an open digit architecture is that while the core arrays are fully utilized, the end arrays use only half of the available digit lines, which wastes valuable semiconductor real estate. As used herein, the terms "core array" and "end array" are used to distinguish between the arrays but not necessarily to indicate a particular functionality.

Layouts to reduce this wasted space have been proposed. As an example, in one proposal, the end arrays are made at half the width of the core arrays and the digit lines traverse the array then wrap back and traverse an adjacent digit line location. This arrangement creates a single digit line in the end arrays that occupies two digit line locations that are each half as long, which results in a close matching of the capacitive loading of the full length digit lines of the fully utilized array that shares sense amplifiers with the end array. Unfortunately, in this arrangement the wrapped digit lines in the end arrays may still perform differently and have different noise characteristics from the straight digit lines in the core arrays.

The inventors have appreciated that there is a need for methods, apparatuses, and systems using open digit architectures that can make use of the extra digit lines in full size end arrays.

BRIEF DESCRIPTION OF THE DRAWINGS

In the drawings, which illustrate embodiments of the invention:

FIGS. 7A and 7B illustrate the basic operation of an open digit architecture when the end arrays are used to repair a single Input/Output (IO), a single IO*, or both an IO and an IO*;

DETAILED DESCRIPTION

In the following detailed description, reference is made to the accompanying drawings that form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

Embodiments disclosed herein include methods, apparatuses, and systems, that use extra digit lines that may exist in full size end arrays of open digit architectures as repair cells to repair faulty memory locations in core arrays.

Figure 1:
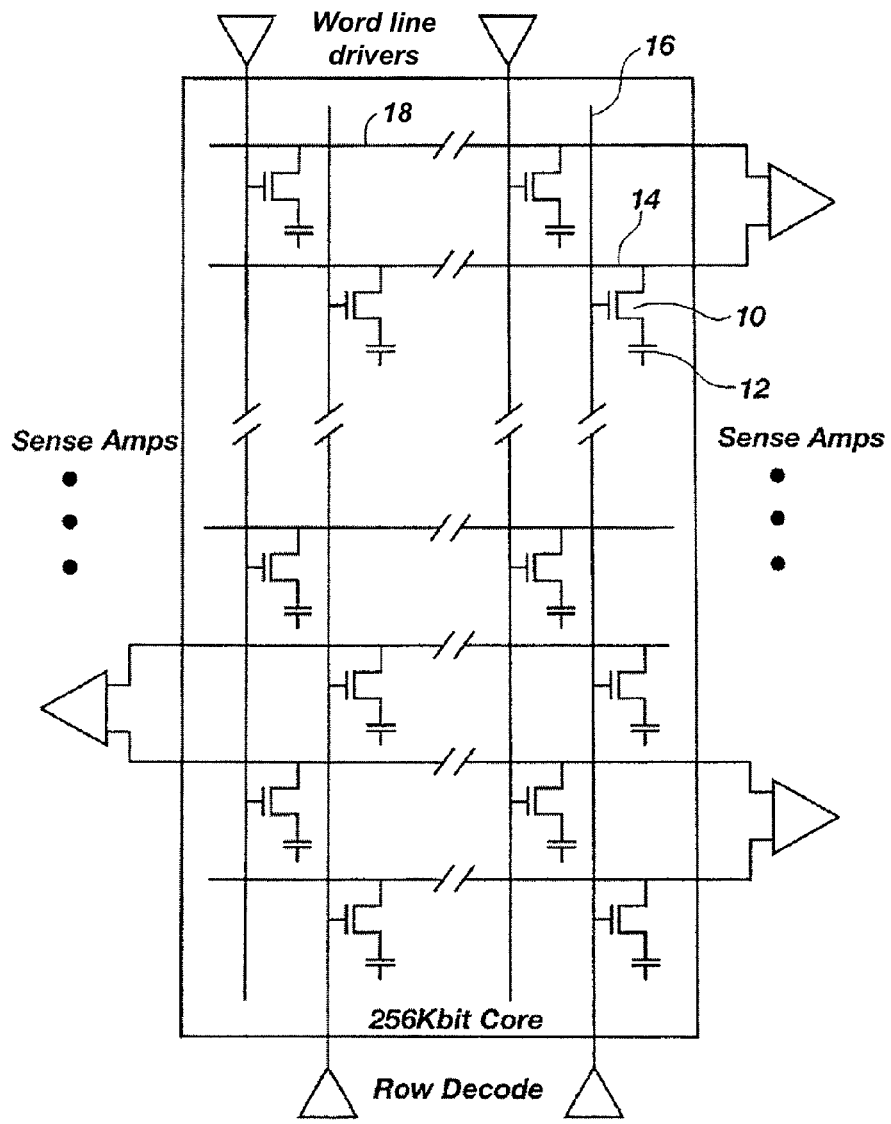
FIG. 1 is a simplified circuit diagram of a folded digit line architecture.

In the folded digit architecture of FIG. 1, a memory cell is an eight square feature (8F2) cell. The intended definition of feature is a minimum realizable process dimension, but generally equates to a dimension that is half of the word line (row) or digit line (column) pitch. The folded array architecture, as shown in FIG. 1, produces an 8F2 memory cell because each word line operably couples (forms a cross-point) with a memory cell transistor on every other digit line and passes around memory cell transistors as field poly on the remaining digit lines. The field poly in each memory cell adds two square features to what would have been a six feature (6F2) cell otherwise. Although the folded array yields a cell that is 33% larger than other array architectures, it also produces superior signal-to-noise performance, especially when combined with some form of digit line twisting.

Figure 2:
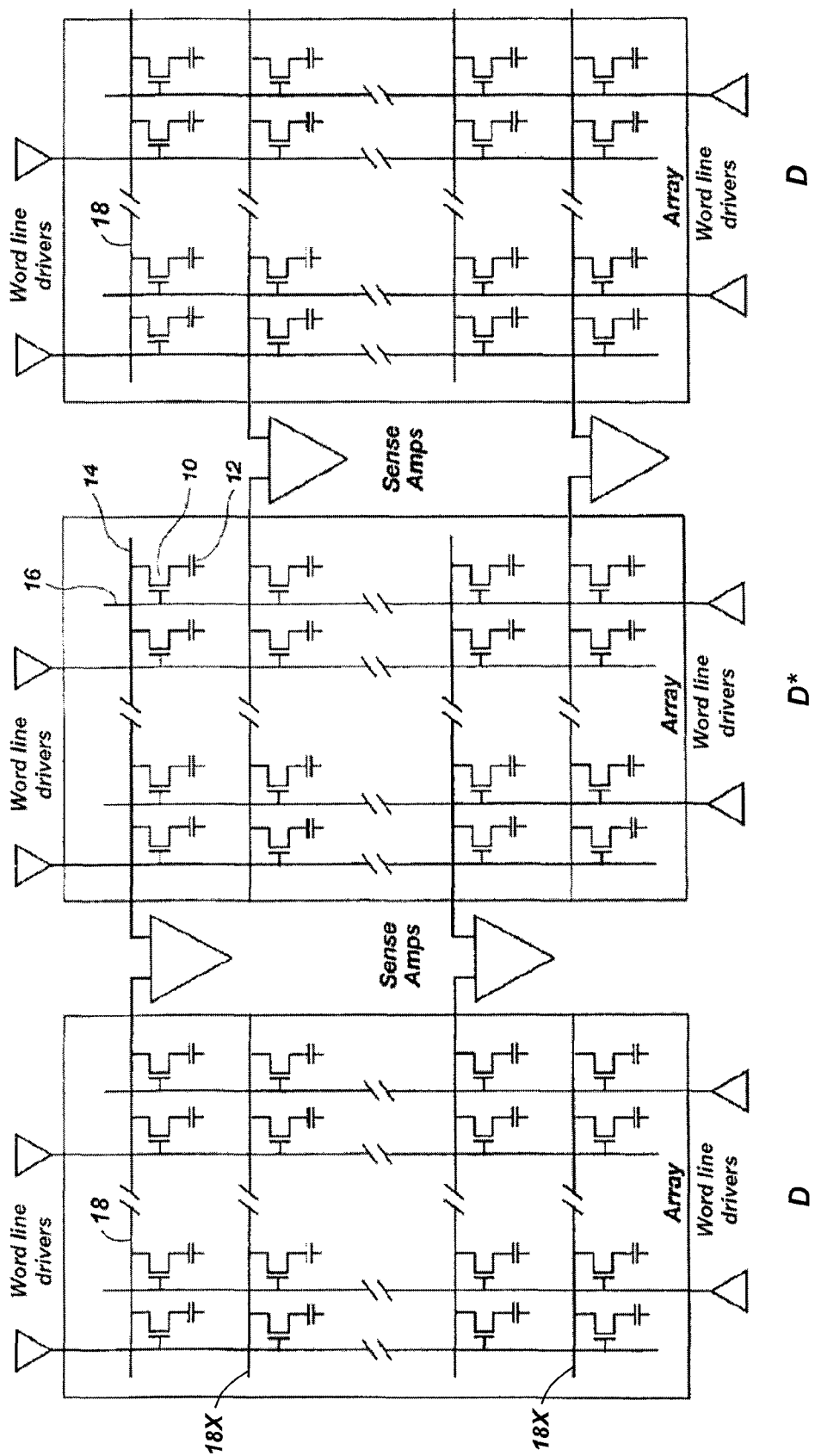
FIG. 2 is a simplified circuit diagram of a conventional open digit line architecture.

An alternative to the folded array architecture is the open digit line architecture. Seen schematically in FIG. 2, this architecture features the sense amplifier circuits between two arrays. Unlike the folded array, though, true and complement digit lines (D and D*) connected to each sense amplifier pair come from separate arrays. Also note that, unlike the folded array architecture, each word line in an open digit line architecture connects to memory cell transistors on every digit line. This cross-point feature at every digit line permits a 25% reduction in memory cell size to only 6F2 since the word lines do not have to pass alternate memory bits as field poly. Unfortunately, as stated earlier the end arrays in open digit line architectures are underutilized, which can be seen by complement digit lines 18X not connecting to a sense amplifier.

Figure 3:
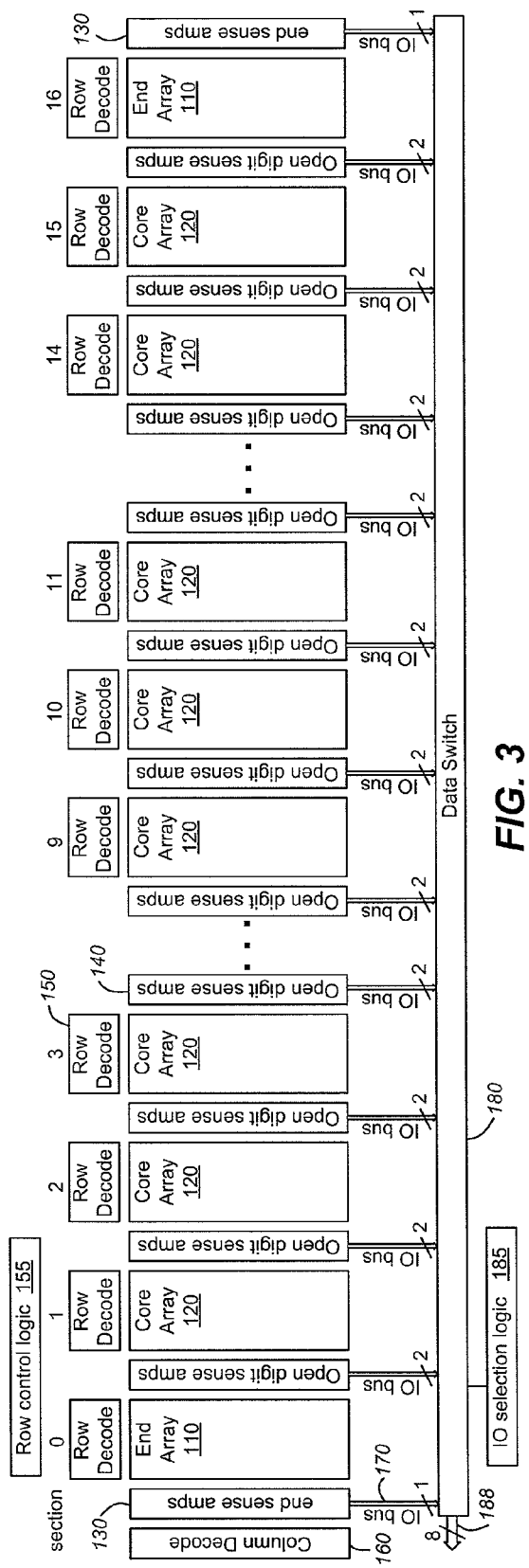
FIG. 3 is a simplified block diagram of a memory array using folded digit sense amplifiers for the end arrays of an open digit architecture.

FIG. 3 is a simplified block diagram of a memory array using folded digit sense amplifiers for the end arrays of an open digit architecture. For clarity and to not obscure the figure in unnecessary detail, element designators are not included on every element within the figures. Unless otherwise specified, elements with the same name in the figures have the same designator. In addition the terms "sense amplifier" and "sense amp" are used interchangeably in this document.

As shown in FIG. 3, arrays of memory cells can be organized into sections (0-16) with end arrays 110 for sections 0 and 16 and core arrays 120 for sections 1-15. The end arrays 110 and core arrays 120 may have the same physical layout, the difference between them being how they are connected to sense amplifiers and how the word lines are selected. Open digit sense amplifiers 140 are positioned between the core arrays 120 and between each end array 110 and a core array 120. Folded digit sense amplifiers 130 are positioned outside the end arrays 110.

Row control logic 155 uses address inputs (not shown) to determine which rows to select in which sections. In addition, the row control logic 155 is used to determine which rows to select in the end arrays 110 when the end arrays 110 are used to repair failures in the core arrays 120.

Row decoders 150 are coupled to each array (110 and 120) to select the currently addressed rows and possibly current repair rows. A column decoder 160 selects the appropriate sense amplifiers (130 and 140) to sense the memory bits and drive the appropriate IO bus 170. Rows and columns may also be referred to herein as word lines and digit lines, respectively. In addition, word lines may be referred to herein as access lines.

Under direction from IO selection logic 185, a data switch 180 selects the appropriate IO buses 170 to connect to a collected bus 188. The IO buses 170 from the core arrays 120 include two IO signals, whereas the IO buses 170 from the end arrays 110 include a single signal. Operational details of the open digit architecture and repair schemes are discussed more fully below.

Of course, many different memory configurations are possible, which may result in a different number of core arrays 120. In addition, a different number of IO signals may be used for the open digit sense amplifiers 140, such as, for example, 2, 4, and 8.

Figure 4A:
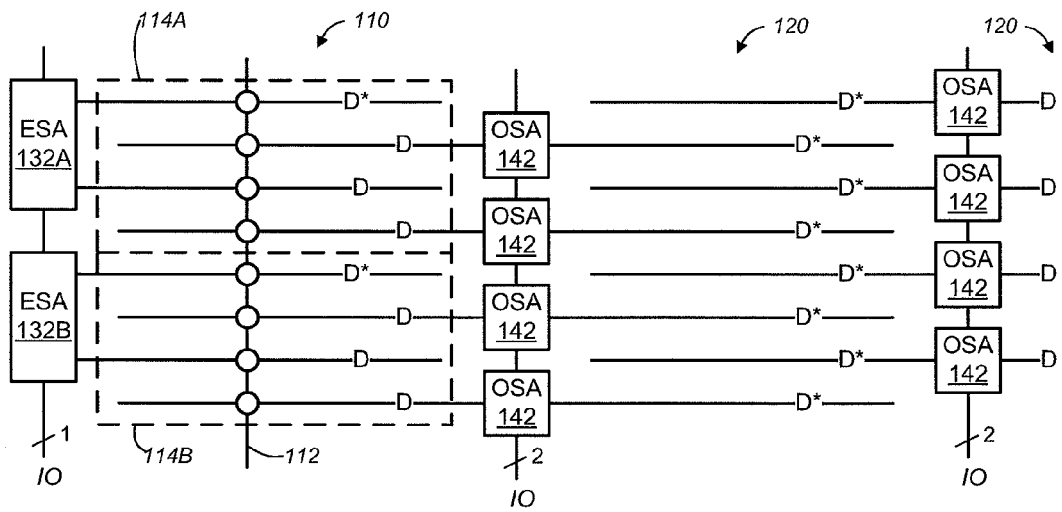
FIGS. 4A-4C are simplified block diagrams showing some possible configurations for digit line and sense amplifier layouts for end arrays of an open digit architecture.
Figure 4B:
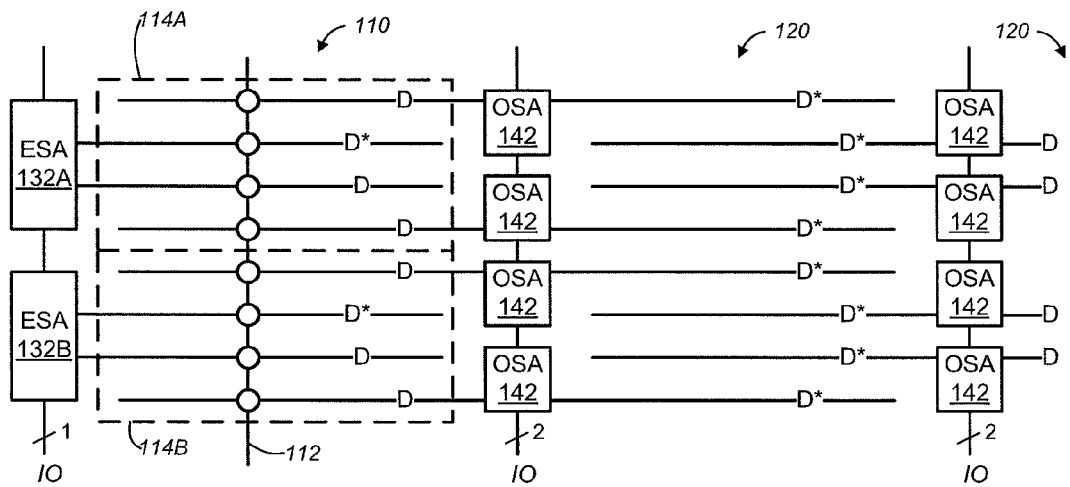
Figure 4C:
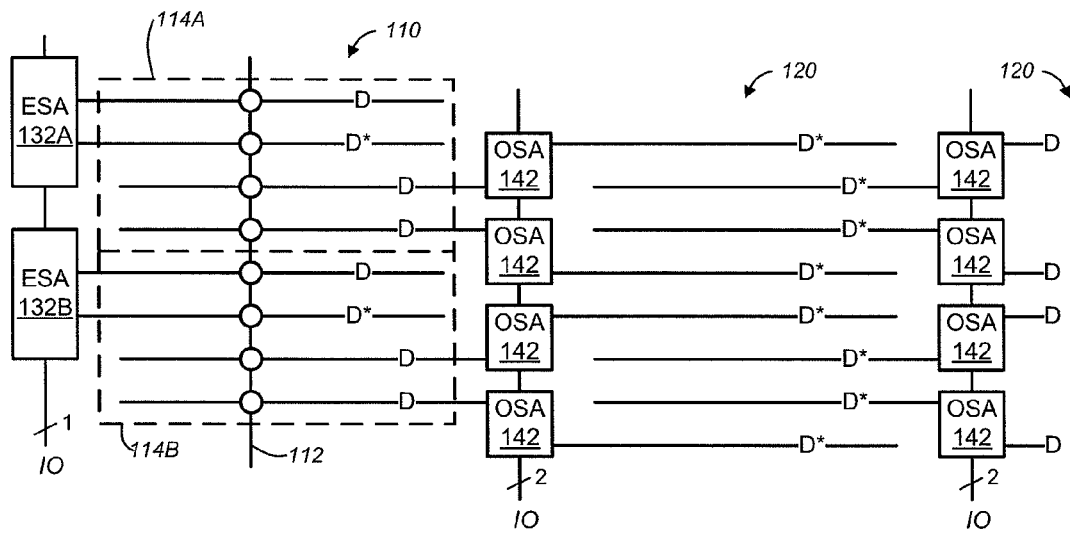

FIGS. 4A-4C are simplified block diagrams showing some possible configurations for digit lines and sense amplifiers for end arrays 110 of an open digit architecture. In FIGS. 4A-4C, each individual open digit sense amplifier 142 shown near the center of the diagram is connected to a digit line D in the end array 110 to the left of the open digit sense amplifier 142. Similarly, each individual open digit sense amplifier 142 connects to a complement digit line D* in the core array 120 to the right of the open digit sense amplifier 142.

The open digit sense amplifiers 142 shown on the right side of FIGS. 4A-4C have a similar arrangement to those in the center except that they connect to complement digit lines D* of a core array 120 to the left and true digit lines D of a core array 120 to the right. An entire group of open digit sense amplifiers 142 (e.g., the group in the center and the group on the right side) form a group of sense amplifiers 140 as shown in FIG. 3.

The end sense amplifiers (132A and 132B) are shown to the left of the end array 110 and connect to a true digit line D and a complement digit line D* of the end array 110 in a folded digit arrangement. The small circles in the end array 110 indicate a cross-point between a word line 112 and a digit line (D, D*) where a memory cell is located. Thus, each end sense amplifier accesses a memory cell on a digit line and a memory cell on a complement digit line to form a full memory bit. An entire group of end sense amplifiers (132A or 132B) form a group of end sense amplifiers 130 as shown in FIG. 3.

For ease of discussion, and not due to any electrical or physical layout reasons, the digit lines in the end arrays 110 may be discussed as belonging to groups 114A and 114B of adjacent digit lines. Thus, in FIG. 4A, an alternating two of the digit lines D of the end array 110 connect to two different open sense amplifiers 142. The other alternating two digit lines are both connected to an end sense amplifier (132A, 132B) as a true digit line D and a complement digit line D*. This addition of folded end sense amplifiers (132A, 132B) creates useable redundant cells that would otherwise be wasted by creating new memory bits stored in true and complement form in a pair of previously unused memory cells in the end array 110. In a conventional open digit architecture, these true digit lines D and complement digit lines D* that are connected to the end sense amplifiers (132A, 132B) would be left unconnected or connected to a reference voltage and not be available for storing memory data.

As can be seen, each end sense amplifier (132A, 132B) can span and correspond to a group 114A, 114B of four digit lines each and create full memory bits at one-fourth the density of the open digit sense amplifiers 142. In other words, each end array 110 in combination with the end sense amplifiers 132A-132B can provide a redundant repair block of memory bits, wherein the number of redundant cells storing non-complement data D is ¼ the number or size of a core array 120 that stores non-complement data D.

FIGS. 4B and 4C illustrate alternate placements of the digit lines D and complement digit lines D* relative to the sense amplifiers (132A, 132B, and 142). Thus, in FIG. 4B the digit line and complement digit line D* for the end sense amplifiers (132A, 132B) are at the center two positions of the groups (114A, 114B) rather than at the alternating positions as shown in FIG. 4A. As a result, the digit lines D for the two open digit sense amplifiers 142 are at the top and bottom positions.

In FIG. 4C, the digit lines D and complement digit lines D* for the end sense amplifier (132A, 132B) are placed as the top two digit lines and the digit lines D for the two open digit sense amplifiers 142 are at the bottom two positions.

Of course, depending on the arbitrary definition of the groups (114A and 114B), those of ordinary skill in the art will recognize that there are other possible combinations of digit lines for different embodiments of the present invention.

Figure 5:
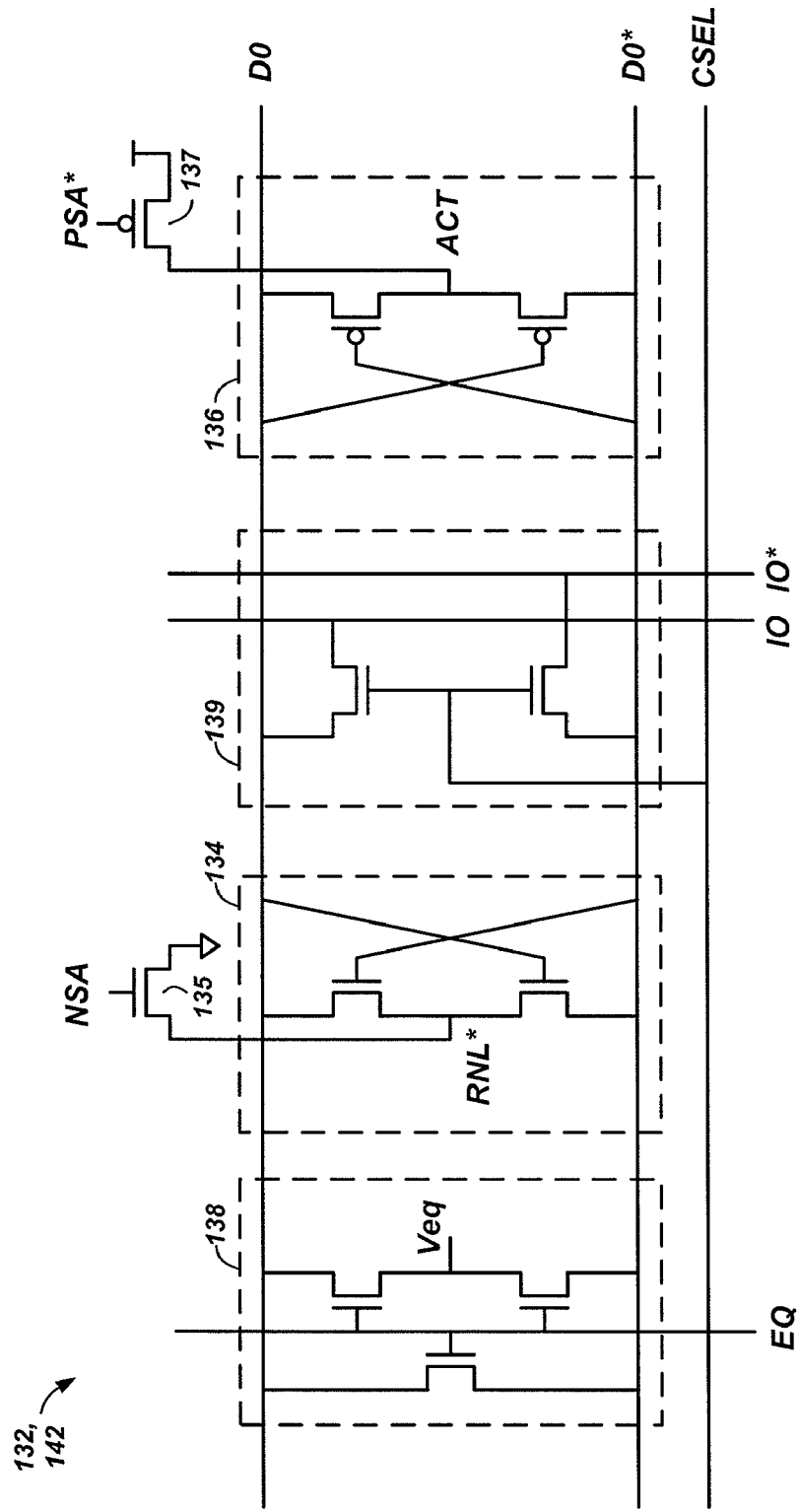
FIG. 5 is a simplified circuit diagram of a sense amplifier, which may be used as a folded digit sense amplifier or an open digit sense amplifier.

FIG. 5 is a simplified circuit diagram of a sense amplifier (132, 142), which may be used as a folded digit sense amplifier or an open digit sense amplifier. Memory devices are typically constructed with complementary digit lines of equal capacitance. Sense amplifiers are connected between the complementary digit lines and can operate to sense the differential voltage, differential current, or a combination thereof across the complementary digit lines. An open digit sense amplifier 142, as illustrated in FIGS. 4A-4C, features the sense amplifier circuits between arrays. True and complement digit lines D0 and D0* come from separate arrays on each side of the sense amplifiers. For the folded digit sense amplifiers 132, the true and complement digit lines D0 and D0* come from the same side of the array. As is generally known in the art, the term "sense amplifier" includes a collection of circuit elements connected to the complementary digit lines D0 and D0* of a DRAM array. This collection typically includes devices for equilibration and bias, one or more N-sense amplifiers, one or more P-sense amplifiers, and devices connecting selected digit lines to IO signal lines.

Operation of the sense amplifier (132, 142) is accomplished by applying various signals to each sense amplifier to fire the sense amplifiers as is well known in the art. As shown in FIG. 5, sense amplifier (132, 142) includes a P-sense amplifier 136 and an N-sense amplifier 134 for sensing charge stored in the selected memory cell of the selected array via a voltage differential on the pair of digit lines D0 and D0*.

An equilibration circuit 138 is provided to equilibrate the digit lines D0 and D0* and includes a transistor coupled between the digit line D0 and the complement digit line D0* and a gate coupled to receive an equilibration signal EQ. The equilibration circuit 138 also includes two transistors coupled in series between the digit line D0 and the complement digit line D0*. These two transistors also include gates coupled to the equilibration signal EQ. The two series transistors have drains coupled to an equilibration voltage Veq, which typically may be set to about Vcc/2. When the signal EQ is at a high logic level, the equilibration circuit 138 effectively shorts digit line D0 and complement digit line D0* such that they are both equilibrated to the voltage Veq.

The P-sense amplifier 136 and N-sense amplifier 134 operate to sense and amplify the differential signal between the pair of digit lines D0 and D0*. These amplifiers (134 and 136) work together to sense the accessed signal voltages and drive the digit lines D0 and D0* to full voltage values of Vcc and ground. The N-sense amplifier 134 includes cross-coupled NMOS transistors and drives the low potential digit line to ground. Similarly, the P-sense amplifier 136 includes cross-coupled PMOS transistors and drives the high potential digit line to Vcc.

The common node of the cross-coupled NMOS transistors is labeled RNL*. Similarly, the common node of the cross-coupled PMOS transistors is labeled ACT (for ACTive pull-up). Initially, RNL* may be biased to Vcc/2 and ACT may be biased to ground. Since the digit line pair D0 and D0* are both initially at Vcc/2 volts, the N-sense-amp transistors remain off due to zero Vgs potential. Similarly, both P-sense-amp transistors remain off due to their positive Vgs potential. A signal voltage develops between the digit line pair D0 and D0* when the memory cell access occurs. While one digit line contains charge from the cell access, the other digit line serves as a reference for the sensing operation.

In many embodiments, the sense amplifier firing may occur sequentially rather than concurrently. The N-sense-amp 134 may fire first and the P-sense-amp 136 second. The N-sense amplifier 134 is fired by providing a signal, labeled NSA to a transistor 135 connecting the common node of the N-sense amplifier to ground. In other words, dropping the RNL* signal toward ground will fire the N-sense-amp 134. As the voltage between RNL* and the digit lines approaches Vt, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amp 134 fires, ACT will be driven toward Vcc by applying a low signal PSA* to PMOS transistor 137, thus connecting the common node of the P-sense amplifier 136 to Vcc. This activates the P-sense-amp 136 that operates in a complementary fashion to the N-sense-amp 134. With the low voltage digit line approaching ground, a strong signal exists to drive the appropriate PMOS transistor into conduction. This will charge the high voltage digit line toward Vcc, ultimately reaching Vcc. Since the memory cell transistor remains on during sensing, the memory cell capacitor will charge to the RNL* or ACT voltage level. The voltage, and hence charge, which the memory cell capacitor held prior to accessing will restore a full level, i.e., Vcc for a logic one and GND for a logic zero.

When P-sense amplifier 136 and N-sense amplifier 134 have sensed the differential voltage across the digit lines D0 and D0*, a signal representing the charge stored in the accessed memory cell is output from the sense amplifier (132, 142) on the IO lines IO and IO*. An access block 139 includes two NMOS transistors that when enabled by a column select signal CSEL, enable the transfer of voltage from the D0 signal to the IO signal and from D0* signal to the IO* signal.

To write to a memory bit, appropriate voltage levels of ground and VCC are placed on the IO and IO* signals and when CSEL is activated, those appropriate voltage levels will be driven onto the D0 and D0* signal, respectively. The values on D0 and D0* are written into the appropriate memory cells that are selected with a row select. Most of the discussion of operation herein focuses on reading the memory arrays. However, unless otherwise specified, memory accesses discussed herein should be considered to cover both reads and writes. Unless a write operation is specifically discussed, a person of ordinary skill in the art would be able to readily understand any differences between performing a read operation and a write operation. Furthermore, FIG. 5 is shown as one example of a sense amp to discuss general sense amp operation. Those of ordinary skill in the art will recognize that many sense amp designs and configurations can be used in embodiments of the present invention.

Figure 6:
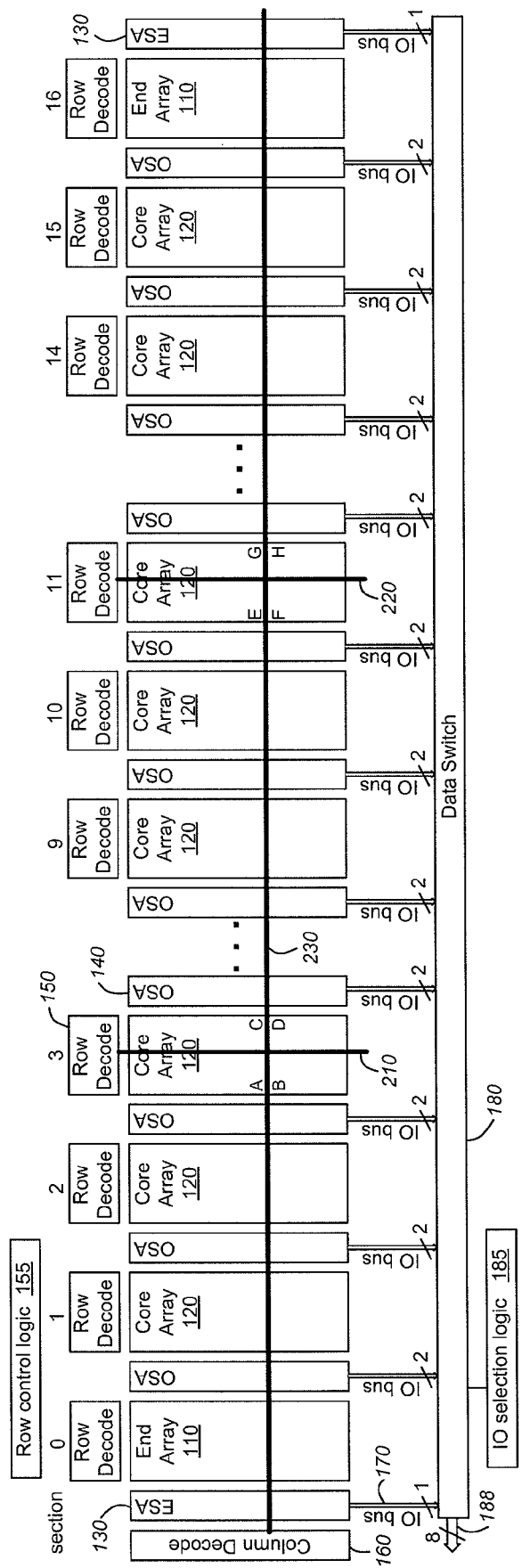
FIG. 6 illustrates the basic operation of an open digit architecture when the end arrays are not used for repairs.

FIG. 6 illustrates the basic operation of an open digit architecture when the end arrays are not used for repairs. In this architecture, eight data bits are accessed from two different sections. For the access, the row decode 150 associated with each section activates (also referred to as fires) a row in each of the two sections by activating access lines (210 and 220). The column decode 160 then generates a column select signal 230 to activate two open digit sense amplifiers in each open digit sense amplifier group 140. In FIG. 6, each I/O coupled to a respective open-digit sense amplifier is indicated as a single signal; however some embodiments may generate both an IO and an IO* signal for each of the activated open-digit sense amplifiers. Two sense amplifiers on each side of section 3 are activated by the column select 230. Thus, the IO bus to the left of section 3 carries IOA and IOB data from two activated sense amplifiers. Similarly, the IO bus to the right of section 3 carries IOC and IOD data from two activated sense amplifiers. In a similar fashion, column select 230 activates sense amplifiers on both sides of section 11. As a result, the IO buses on the sides of section 11 carry IOE and IOF for the left side and IOG and IOH for the right side.

In an open digit architecture, one section is used as the active array for the sense amps and adjacent sections on either side are used as reference arrays for the sense amps. For example, when section 3 is fired, section 2 serves as a reference array for the sense amps between sections 2 and 3 to generate IOA and IOB. Similarly, section 4 serves as a reference array for the sense amps between sections 4 and 3 to generate IOC and IOD. In many memory organizations, the reference cells act as a pre-charged reference voltage level to compare to the accessed memory cell on the other side of the sense amp. Thus, the word lines of the reference array are generally not "fired" because the sense amp senses the difference between the pre-charged voltage level that stays relatively stable on the reference bit and the accessed voltage level that will begin to go low or high from the accessed memory cell.

The data switch 180 can perform an IO steering function because it knows to select the two IOs on each side of the currently fired sections. Thus the data switch 180, in cooperation with the row control logic 155, and IO selection logic 185, selects the appropriate 8 IO signals to be communicated on the collected bus 188. For normal operation, when no repairs are made, the end sense arrays 130 are not used.

Embodiments of the present invention can repair large blocks of cells, not just discrete rows of cells or columns of cells. For example, sometimes an IO may fail because one or more of the sense amps in the group of open digit sense amps 140 fails. As another example, a row decoder may fail, rendering the entire section attached thereto inoperable. The large block repairs possible with embodiments of the present invention can be performed without the need to include complete redundant blocks and instead use otherwise wasted redundant elements in the end arrays 110. In addition, because the end arrays 110 are one-fourth the size of the core arrays 120, additional flexibility is achieved for a wide variety of repair scenarios. As non-limiting examples, some of these repair scenarios are discussed in detail.

For clarity in the drawings, in the following description of various repair scenarios, designators for word line activation and column selection are not included. It will be apparent from the drawings that the bold lines from the appropriate row decoders indicate a fired word line and bold lines from the column decoders indicate active column select lines.

FIGS. 7A and 7B illustrate the basic operation of an open digit architecture when the end arrays are used to repair a single IO a single IO*, or both an IO and an IO*. In FIG. 7A a single IO adjacent to section 3 is replaced with an IO from the folded digit sense amplifiers 110 (also referred to herein as repair sense amplifiers) adjacent to section 0. For example, during testing if IOA is determined to be faulty when section 3 is fired, the row control logic 155, IO selection logic 185, and data switch 180 can be configured to select IOI from section 0 rather than IOA from section 3, thereby replacing IOA with IOI. As discussed earlier, the fault on IOA may be from a number of different defects, such as, for example, defects in the access lines, digit lines, memory bits, sense amps, IO line, or IO* line.

In operation, to repair the fault, section 3 and section 11 are still fired as in normal operation. The sense amps on both sides of sections 3 and 11 still generate IOs (A-F) as in normal operation, even though IOA may be inaccurate. To perform the repair, section 0 is also fired to activate redundant memory bits in section 0. One of the sense amps in the group of end sense amps 130 adjacent to section 0 is activated to generate IOI as a replacement for IOA. The data switch then assembles IOI with IOs (B-H) to create the signals communicated on the 8-bit collected bus 188 by selecting IOI rather than IOA.

In FIG. 7B, a single IO adjacent to section 2 is replaced with an IO from the folded digit sense amplifiers 110 adjacent to section 16. For example, during testing if A* (or IOA to which A* is coupled) is determined to be faulty when section 2 is fired, the row control logic 155, IO selection logic 185, and data switch 180 can be configured to replace IOA with IOJ in section 16. In the FIG. 7B example, the complement digit lines in section 2 are the active digit lines and sections 1 and 3 provide the reference digit lines. Therefore, for IOA, the active digit line for the IOA sense amp comes from A* in section 2 and the reference digit line for the IOA sense amp comes from a corresponding digit line in section 3.

In operation, to repair the fault on IOA, section 2 and section 11 are still fired as in normal operation. The sense amps on both sides of sections 2 and 11 still generate IOs (A-F) as in normal operation, even though IOA may be inaccurate. To perform the repair, section 16 is also fired to activate redundant memory bits in section 16. One of the sense amps in the group of end sense amps 130 adjacent to section 16 is activated to generate IOJ as a replacement for IOA. The data switch then assembles IOJ with IOs (B-H) to create the signals communicated on the 8-bit collected bus 185. Of course, the scenarios in FIGS. 7A and 7B can be combined so combinations of failures on A and A* are repaired.

Figure 8:
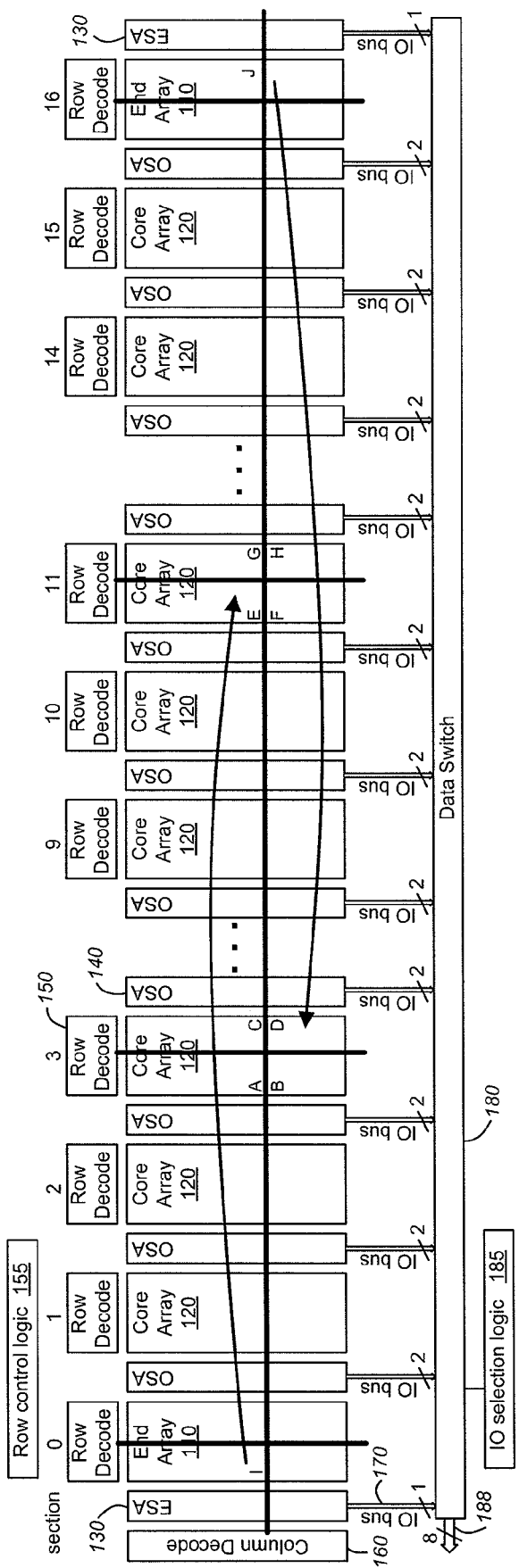
FIG. 8 illustrates the basic operation of an open digit architecture when the end arrays are used to repair any two IOs or IO*s.

FIG. 8 illustrates the basic operation of an open digit architecture when the end arrays are used to repair any two IOs or IO*s. In FIG. 8, any one of IOs A-D may be replaced with an IO from the folded digit sense amplifiers 110 adjacent to section 16. Similarly, any one of IOs E-H may be replaced with an IO from the folded digit sense amplifiers 110 adjacent to section 0. For example, perhaps during testing IOD is determined to be faulty in section 3 and IOG is determined to be faulty in section 11. The row control logic 155, IO selection logic 185, and data switch 180 can be configured to replace IOD with IOJ in section 16 and replace IOG with IOI in section 0.

In operation, to repair the fault on IOD and IOG, section 3 and section 11 are still fired as in normal operation. The sense amps on both sides of sections 2 and 11 still generate IOs (A-F) as in normal operation, even though IOD and IOG may be inaccurate. To perform the repair, sections 0 and 16 are also fired to activate redundant memory bits in sections 0 and 16. One of the sense amps in the group of end sense amps 130 adjacent to section 0 is activated to generate IOI and one of the sense amps in the group of end sense amps 130 adjacent to section 16 is activated to generate IOJ. The data switch then assembles IOI and IOJ in an appropriate order with IOs (A-C, E, F, and H) to create the signals communicated on the 8-bit collected bus 188.

Figure 9:
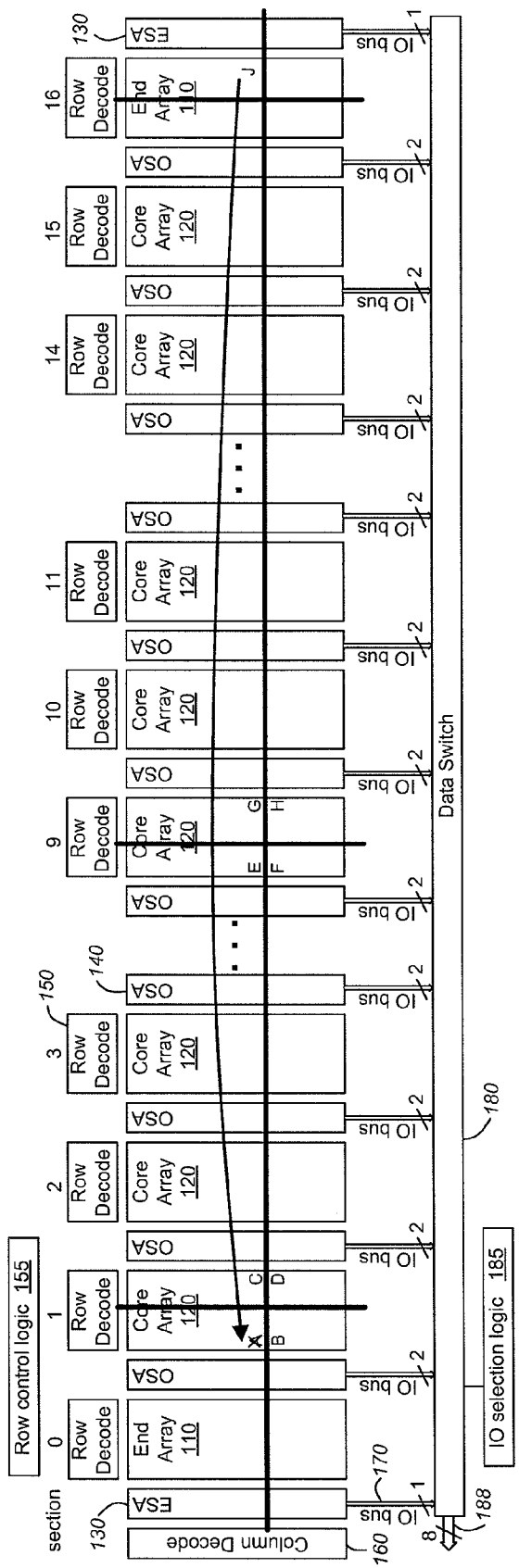
FIG. 9 illustrates the basic operation of an open digit architecture when the end arrays are used to repair IOs in arrays adjacent to the end arrays.

FIG. 9 illustrates the basic operation of an open digit architecture when the end arrays are used to repair IOs in arrays adjacent to the end arrays. Core arrays 120 that are adjacent to the end arrays 110 (e.g., sections 1 and 15 in the FIG. 9 embodiment) are treated differently than other core arrays 120. As an example, if section 1 is fired, the end array 110 labeled section 0 acts as a reference array. Therefore, firing a word line in section 0 to access redundant bits would also cause an access to the reference digit lines used by the group of open digit sense amplifiers 140 between section 0 and section 1. If the reference digit lines are accessed, they will not perform their proper function of providing a reference voltage and inaccurate results may be sensed.

Thus, when an IO from a core array that is adjacent to an end array needs to be repaired, the end array on the far side, away from the core array being repaired, should be used to accomplish the repair. In FIG. 9, IOA in section 1 is replaced with an IO from the folded digit sense amplifiers 130 adjacent to section 16 because section 0 is unavailable for a repair of IOA or IOB. For example, during testing if IOA is determined to be faulty when section 1 is fired, the row control logic 155, IO selection logic 185, and data switch 180 can be configured to replace IOA with IOJ in section 16. In operation, to repair the fault on IOA, section 1 and section 9 are still fired as in normal operation. The sense amps on both sides of sections 1 and 9 still generate IOs (A-F) as in normal operation, even though IOA may be inaccurate. To perform the repair, section 16 is also fired to activate redundant memory bits in section 16. One of the sense amps in the group of end sense amps 130 adjacent to section 16 is activated to generate IOJ as a replacement for IOA. The data switch then assembles IOJ with IOs (B-H) to create the signals communicated on the 8-bit collected bus 188.

Figure 10:
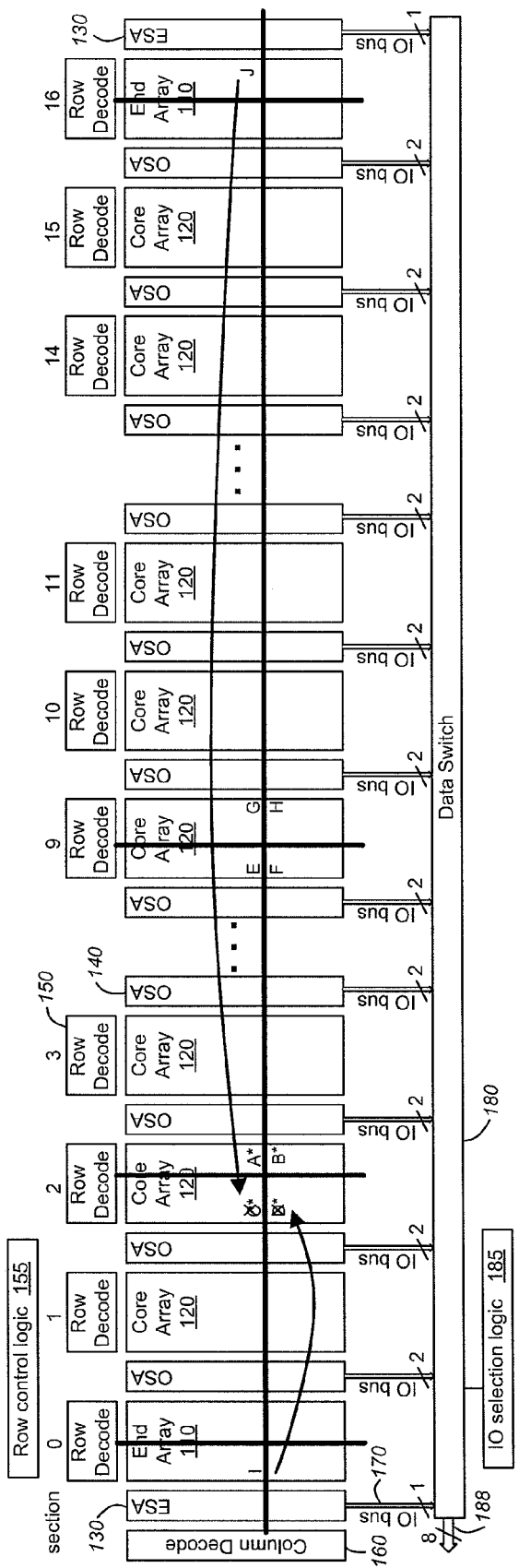
FIG. 10 illustrates the basic operation of an open digit architecture when the end arrays are used to repair IOs in arrays two away from the end arrays.

FIG. 10 illustrates the basic operation of an open digit architecture when the end arrays are used to repair IOs in arrays two away from the end arrays. With core arrays 120 that are two away from an end array 110, some margin loss may be experienced if the end array is also fired to access redundant memory in the end array 110. For example, when section 2 is being accessed, section 1 would serve as a reference array. Then, assume section 0 is also accessed as a repair block. The digit lines in section 1 would be used as reference digits for the sense amps 140 between section 0 and section 1. Since section 0 is being accessed for repair, the IOs between section 0 and 1 would not be used. However, the fact that all the digit lines in section 1 are being accessed by the sense amps 140 as reference lines could cause coupling and increased noise. As a result, it may be advisable to use the end array 110 at the opposite end from section 2 to repair section 2.

In FIG. 10, digit line C* may be faulty so IOC in section 2 is replaced with an IO from the folded digit sense amplifiers 110 adjacent to section 16 because repairing with section 0 may cause increased noise. For example, during testing if IOC is determined to be faulty when section 2 is fired, the row control logic 155, IO selection logic 185, and data switch 180 can be configured to replace IOC with IOJ in section 16. In operation, to repair the fault on IOC, section 2 and section 9 are still fired as in normal operation. The sense amps 140 on both sides of sections 2 and 9 still generate IOs (A-F) as in normal operation, even though IOC may be inaccurate. To perform the repair, section 16 is also fired to activate redundant memory bits in section 16. One of the sense amps in the group of end sense amps 130 adjacent to section 16 is activated to generate IOJ as a replacement for IOC. The data switch then assembles IOJ with IOs (A, B, and D-H) to create the signals communicated on the 8-bit collected bus 185.

FIG. 10 also illustrates the possibility of repairing IOD. For a combination of repairing both IOC and IOD, section 0 may be effectively used as a repair block because any margin loss will be ignored. The margin loss due to noise or coupling would be experienced in the sense amps between sections 1 and 2. However, since both IOC and IOD are being replaced, any values sensed by these sense amps would be ignored. Thus, to repair faults on IOC and IOD, section 2 and section 9 are still fired as in normal operation. The sense amps on both sides of sections 2 and 9 still generate IOs (A-F) as in normal operation, even though IOC and IOD may be inaccurate. To perform the repair, section 16 is also fired to activate redundant memory bits in section 16 and section 0 is also fired to activate redundant memory bits in section 0. One of the sense amps in the group of end sense amps 130 adjacent to section 16 is activated to generate IOJ as a replacement for IOC and one of the sense amps in the group of end sense amps 130 adjacent to section 0 is activated to generate IOI as a replacement for IOD. The data switch then assembles IOI and IOJ with IOs (A, B, and E-H) to create the signals communicated on the 8-bit collected bus 185.

Figure 11:
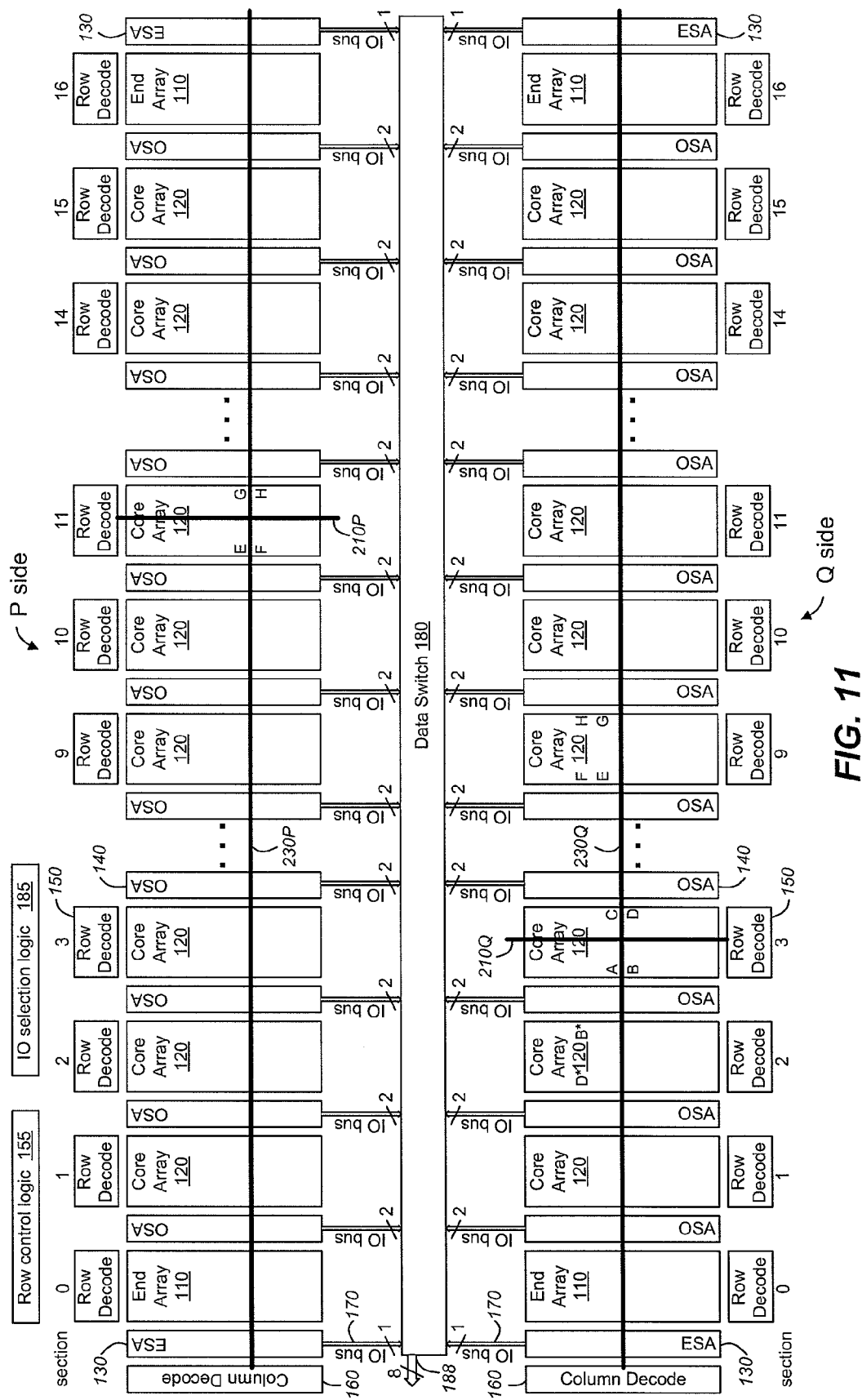
FIG. 11 illustrates the basic operation of an open digit architecture including two stacked half banks when the end arrays are not used for repairs.

FIG. 11 illustrates the basic operation of an open digit architecture including two stacked half banks when the end arrays are not used for repairs. In some embodiments, a bank may be split into two half-banks indicated in FIG. 11 as a P side and a Q side. In these half-bank architectures, any two sections from either the P side or the Q side may be fired to generate the 8 bits for the collected bus 188. This half-bank architecture results in additional column select lines (230P and 230Q), which enables more flexibility in repair scenarios. The elements of the half-bank architecture illustrated in FIG. 11 are similar to those of FIG. 3 and individual details are not explained again except to point out where there may be differences. For ease of illustration, the row control logic 155 and IO selection logic 185 are shown as a single block. Those of ordinary skill in the art will recognize that the row control logic 155 and IO selection logic 185 may be distributed at multiple locations, portions of which may be included in parts of the row decodes 150, column decodes 160, and data switch 180. As with the embodiment of FIG. 6, the FIG. 11 embodiment is configured for supplying a total of eight data bits from two different sections.

For a normal operation, as illustrated in FIG. 11, sections 11P and 3Q are accessed. For the access, the row decode 150 associated with each section fires a row in each of the two sections by activating access lines (210P and 210Q). The column decode 160 for each side then generates a column select signal (230P and 230Q) to activate two open digit sense amplifiers in each open digit sense amplifier group 140. In FIG. 11, section 11P is activated by firing word line 210P. Two sense amps on each side of section 11P are activated by the column select signal 230P. Thus, the IO bus to the left of section 11P carries IOE and IOF data from the two activated sense amps. Similarly, the IO bus to the right of section 11P carries IOG and IOH data from the two activated sense amps. In a similar fashion, row access line 210Q and column select signal 230Q combine to activate sense amps on both sides of section 3Q. As a result, the IO buses on the sides of section 2Q carry IOA and IOB for the left side and IOC and IOD for the right side.

The data switch 180, in cooperation with the row control logic 155, and IO selection logic 185, selects the appropriate 8 IO signals to be communicated on the collected bus 188. With the two stacked half banks, two core arrays could be fired on the P side, two core arrays could be fired on the Q side, or one core array on each side, as shown in FIG. 11.

Figure 12:
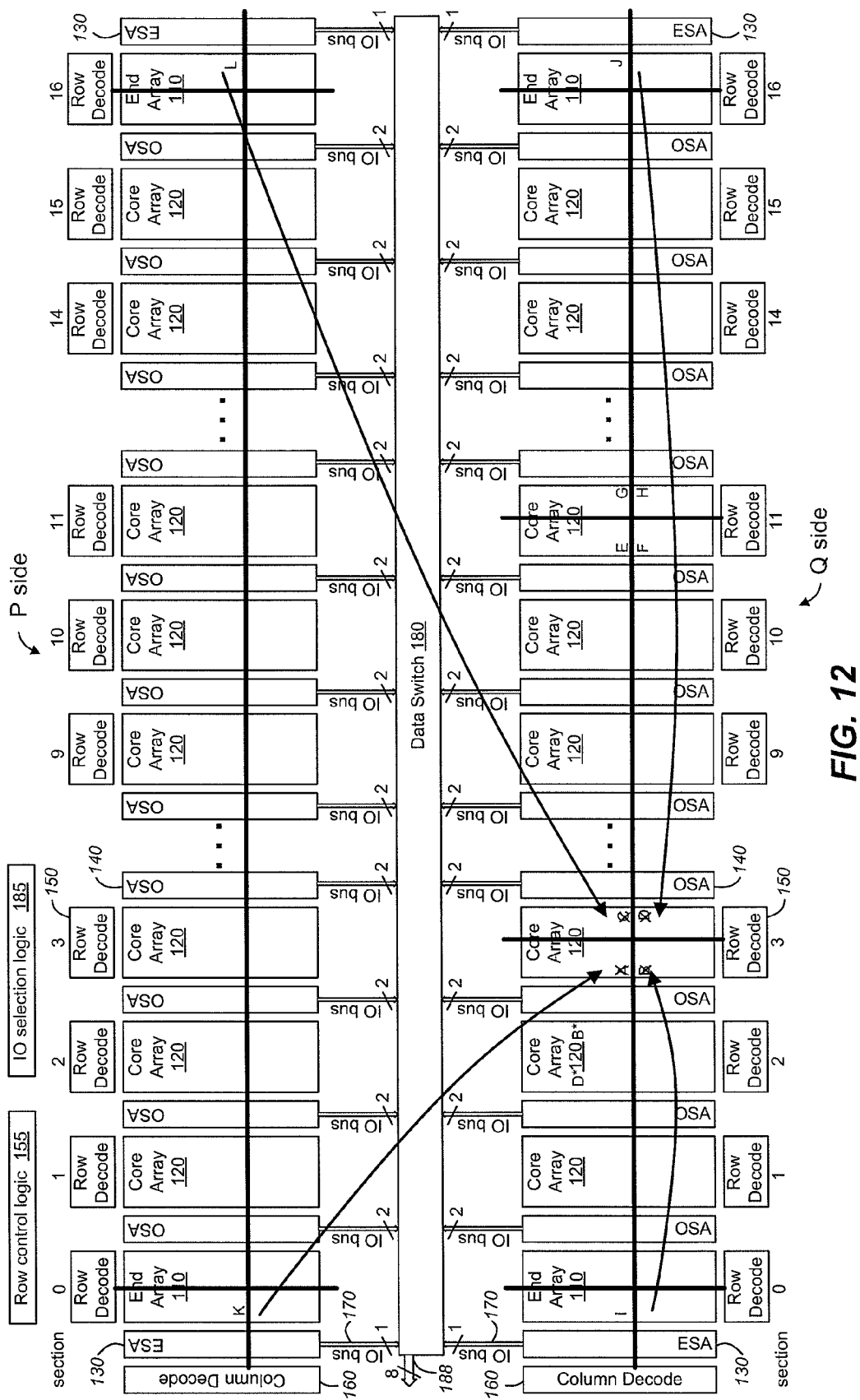
FIG. 12 illustrates the basic operation of an open digit architecture including two stacked half banks when the end arrays are used to repair a full section.

FIG. 12 illustrates the basic operation of an open digit architecture including two stacked half banks when the end arrays are used to repair a full section. Since each end array includes ¼ of the bits of a core array, all four end arrays 110 in the stacked half bank architecture may be used to replace an entire core array. For example, during testing if IOs A-C are determined to be faulty when section 3Q is fired, the row control logic 155, IO selection logic 185, and data switch 180 can be configured to replace IOs A-C with a combination of IOI, IOJ, IOK, and IOL from sections 0Q, 16Q, 0P and 16P, respectively. In operation, to repair the fault, section 11Q will fire as in normal operation. Section 3Q may also be fired. However, since all of section 3Q is being replaced, the firing of section 3Q may be suppressed (e.g., by not activating the word line) to reduce power consumption. The sense amps on both sides of section 11Q generate IOs E-H as in normal operation. The sense amps on both sides of section 3Q generate IOs A-D even though they may be inaccurate. To perform the repair, sections 0Q, 16Q, 0P and 16P are fired to activate redundant memory bits in these sections. One of the sense amps in the each group of end sense amps 130 adjacent to each of the end arrays 110 is activated to generate IOs I-L as replacements for IOs A-D. The data switch then assembles IOs I-L with IOs E-H to create the signals communicated on the 8-bit collected bus 188.

Because of the ability to suppress the firing of a section and save power, a repair scenario may repair all the IOs in a section even if they are not all bad. For example, if IOs A-C are bad, it may be useful to replace all of IOs A-D so the section may be shut down, even though IOD was functional.

Figure 13:
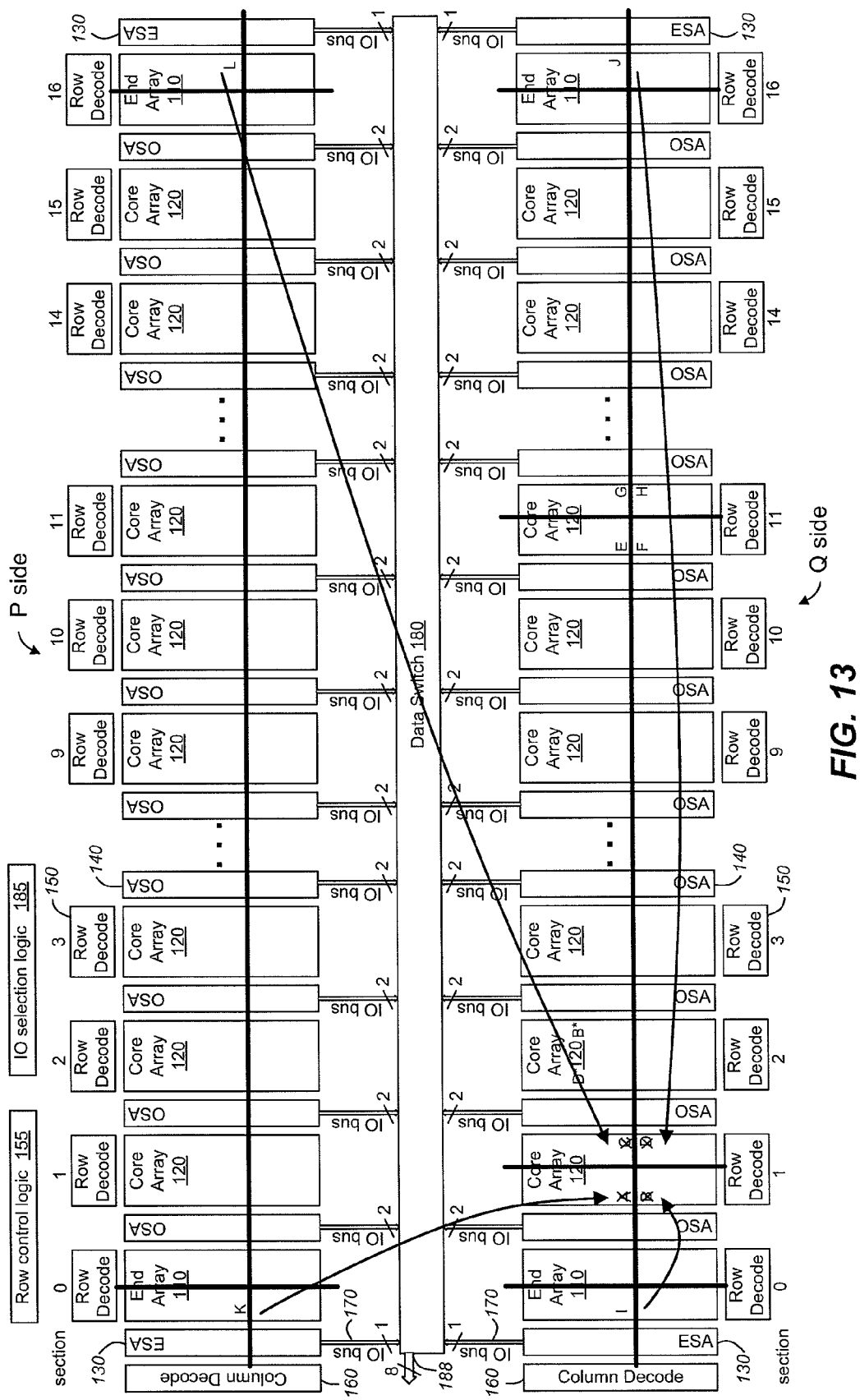
FIG. 13 illustrates the basic operation of an open digit architecture including two stacked half banks when the end arrays are used to repair IOs in arrays adjacent to the end arrays.

FIG. 13 illustrates the basic operation of an open digit architecture including two stacked half banks when the end arrays are used to repair IOs in arrays adjacent to the end arrays. Recall from the discussion of FIG. 9 that end arrays 110 are not used to replace IO failures in adjacent core arrays 120. However, in the two stacked half bank architecture, this type of repair is possible because the entire core array can be shut down. For example, in FIG. 13, with section 1Q shut down, section 0Q can be fired without adverse effects because the adjacent 1Q section is not being used. Of course, in the FIG. 13 example, the firing of section 1Q should be suppressed so there are no adverse effects on section 0Q. Operation of the example in FIG. 13 is the same as that for FIG. 12, except for the use of section 1Q rather than section 3Q and is therefore not discussed in detail.

Figure 14:
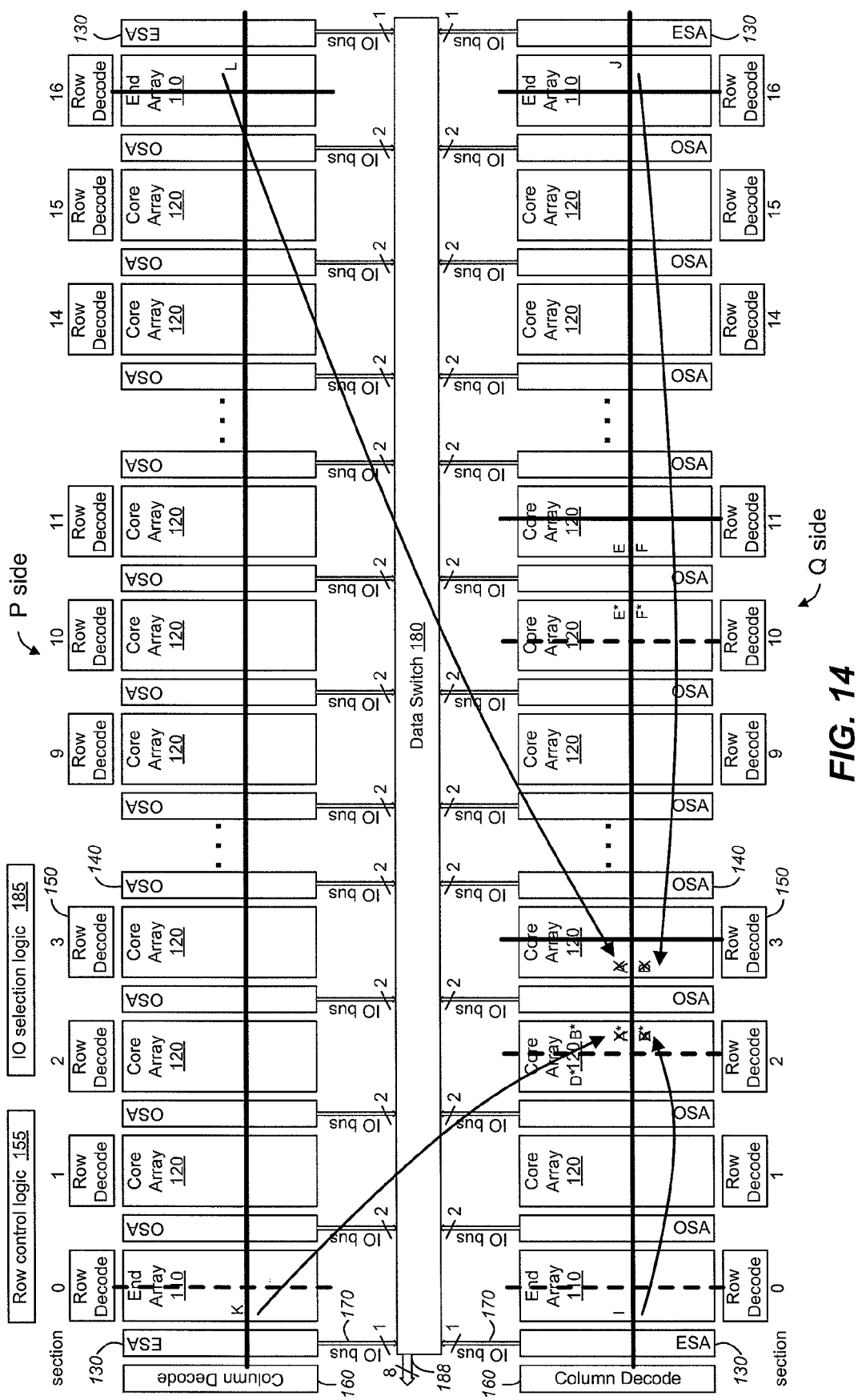
FIG. 14 illustrates the basic operation of an open digit architecture including two stacked half banks when the end arrays are used to replace an entire group of open digit sense amplifiers.

FIG. 14 illustrates the basic operation of an open digit architecture including two stacked half banks when the end arrays are used to replace an entire group 140Q of open digit sense amplifiers. In the repair scenario illustrated in FIG. 14 the group of open digit sense amplifiers 140 between sections 2Q and 3Q is completely replaced. This example shows two different accesses. A first access is shown by solid bold lines for word line firing in sections 3Q, 11Q, 16Q, and 16P. A second access is shown by dashed bold lines for word line firing in sections 2Q, 10Q, 0Q, and 0P. For the first access, IOL from section 16P and IOJ from section 16Q are used to respectively replace faulty IOA and IOB from section 3Q. Similarly, for the second access, IOI from section 0Q and IOK from section 0P are used to respectively replace faulty IOA* and IOB* from section 2Q.

Figure 15:
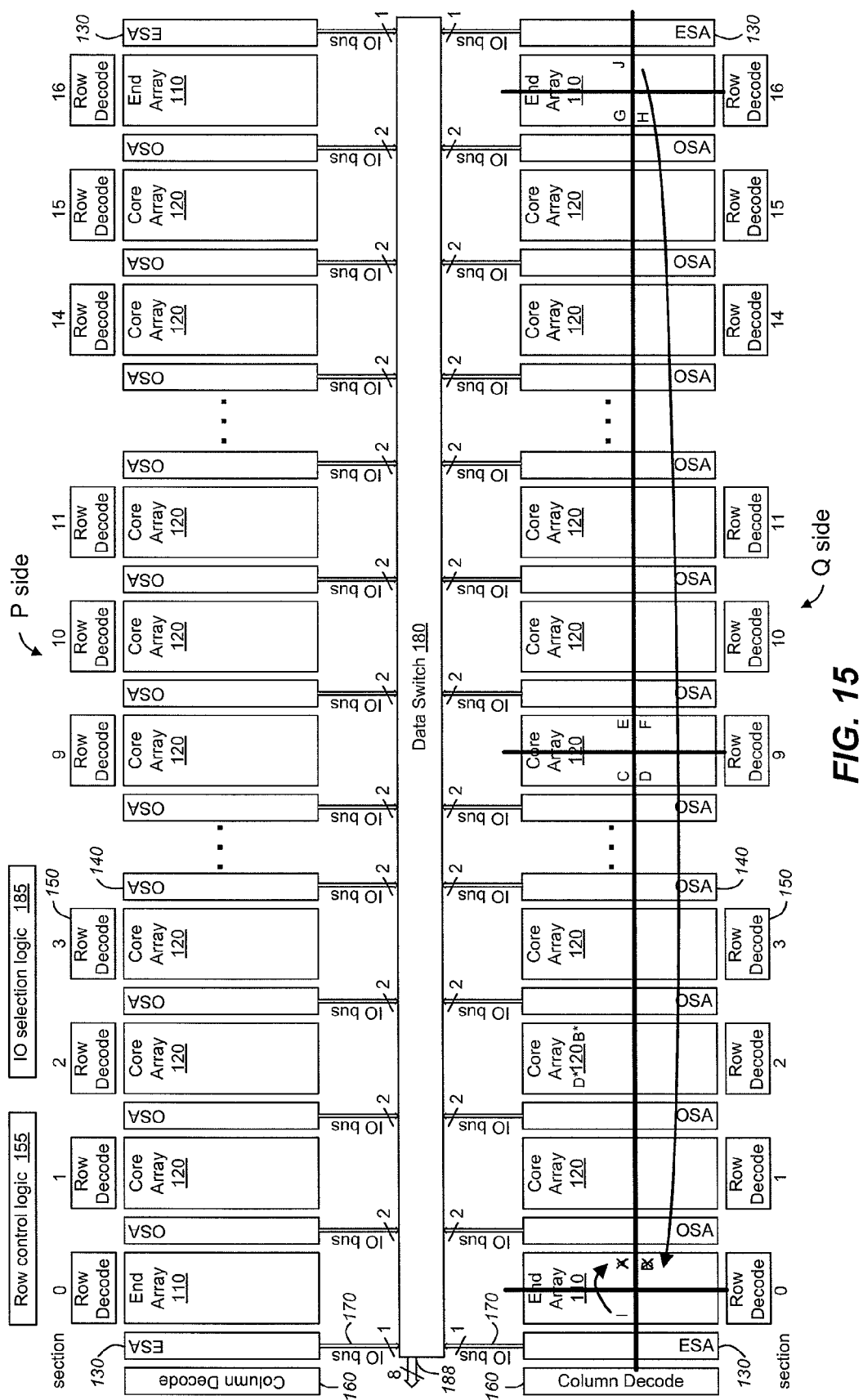
FIG. 15 illustrates the basic operation of an open digit architecture including two stacked half banks when end arrays are used to repair a fault in an end array.

FIG. 15 illustrates the basic operation of an open digit architecture including two stacked half banks when end arrays are used to repair a fault in an end array. In the FIG. 15 example, perhaps the open digit sense amp group 140 between section 0Q and section 1Q includes faults related to section 0Q. In this case, even though IOA and IOB from section 0Q may be defective, section 0Q can still be used to replace one of IOA or IOB (in this case IOA) and section 16Q can be used to replace the other of IOA or IOB (in this case IOB). In operation, to repair the fault, section 0Q, 9Q, and 16Q will fire as in normal operation. The sense amps on both sides of section 9Q generate IOs C-F as in normal operation. The sense amps on the left side of section 16Q fire to generate IOG and IOH. The sense amps on the right side of section 0Q fires to generate IOA and IOB even though they may be inaccurate. To effect the repair, one of the sense amps in each of the folded digit sense amps 130 adjacent to each of the end arrays 110 is activated to generate IOI and IOJ as replacements for IOA and IOB. The data switch then assembles IOI and IOJ with IOs C-H to create the signals communicated on the 8-bit collected bus 185 bus 188.

Figure 16:
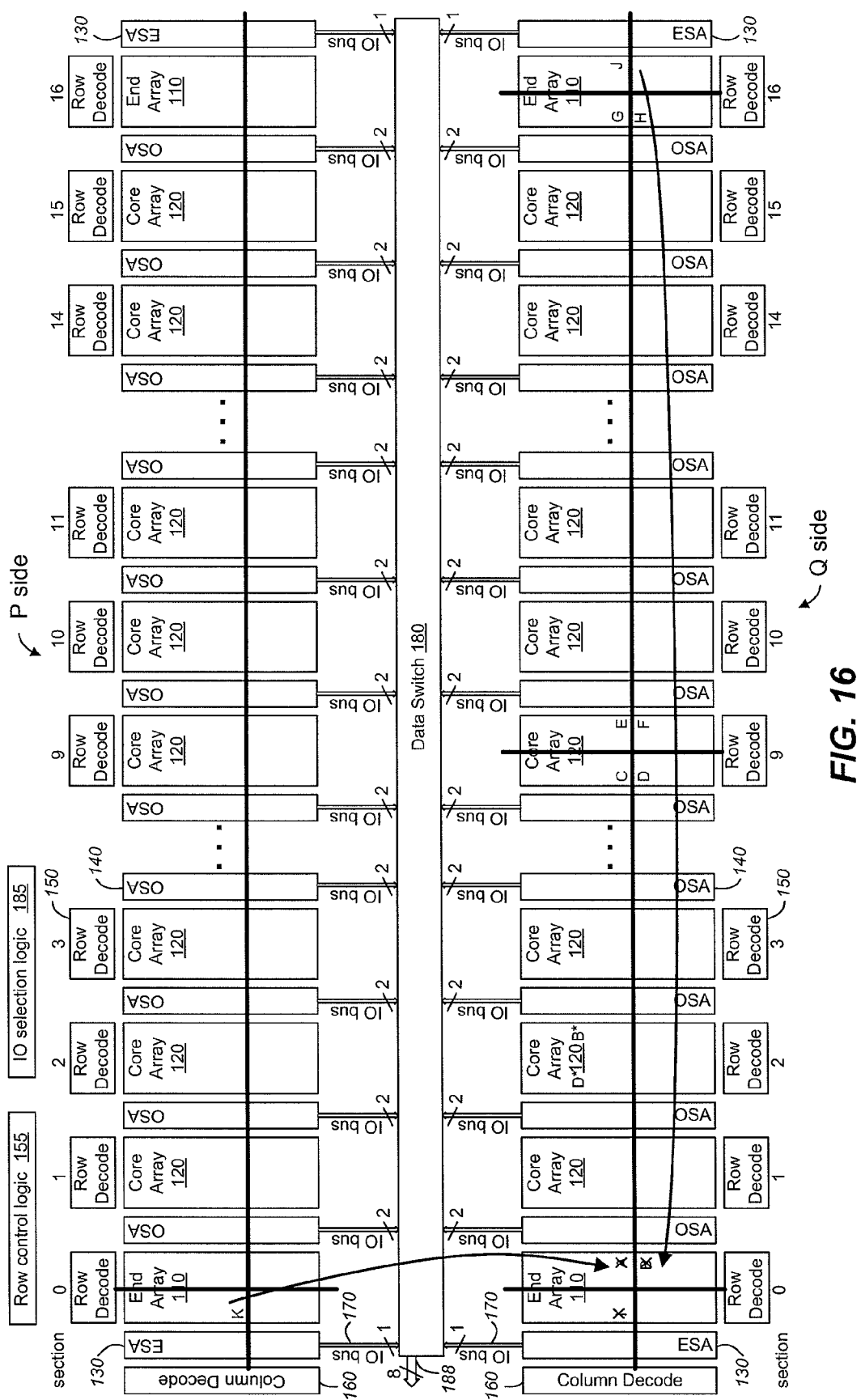
FIG. 16 illustrates the basic operation of an open digit architecture including two stacked half banks when a good end array is used to repair a defective end array.

FIG. 16 illustrates the basic operation of an open digit architecture including two stacked half banks when a good end array is used to repair a defective end array. The example repair scenario in FIG. 16 is an extension of the repair scenario in FIG. 15. In FIG. 15 IOA and IOB were bad, but repair IOI was good. In FIG. 16, IOA and IOB are still bad and repair IOI is also bad. As a result, the entire end array for section 0Q is replaced. In operation, to repair the fault, section 9Q and 16Q will fire as in normal operation. Section 0Q may also be fired. However, since all of section 0Q is being replaced, the firing of section 0Q may be suppressed to reduce power consumption. Section 0P is fired for that repair section. The sense amps on both sides of section 9Q generate IOs C-F as in normal operation. The sense amps on the left side of section 16Q fire to generate IOG and IOH. One sense amp in the group of end sense amps 130 adjacent to section 16Q is activated to generate IOJ as a replacement for IOB. One sense amp in the group of end sense amps 130 adjacent to section 0P is activated to generate IOK as a replacement for IOA. The data switch then assembles IOJ and IOK with IOs C-H to create the signals communicated on the 8-bit collected bus 188.

Figure 17:
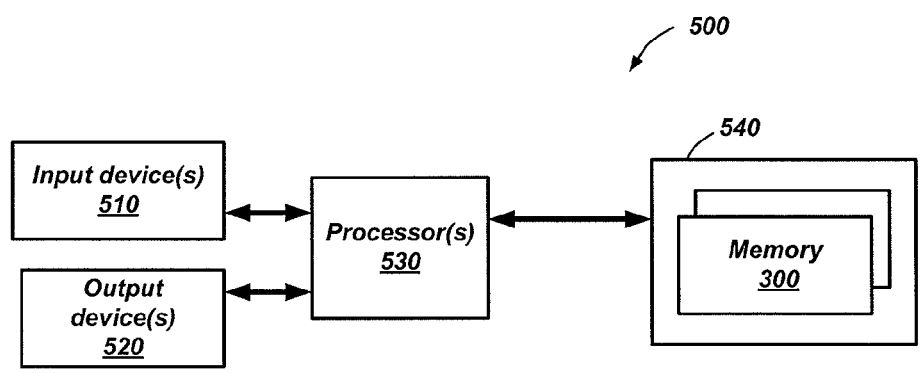
FIG. 17 is a simplified block diagram of a system implemented according to one or more embodiments described herein.

FIG. 17 is a simplified block diagram of a system implemented according to one or more embodiments described herein. As shown in FIG. 17, an electronic system 500 includes at least one input device 510, at least one output device 520, a memory access device, such as one or more processors 530, and one or more memory devices 540. The memory devices 540 include at least one semiconductor memory 300 incorporating at least one embodiment of the end memory block or methods described herein in a memory device. The electronic system 500 may be part of a number of computing, processing, and consumer products. As non-limiting examples, some of these products may include personal computers, handheld devices, cameras, phones, wireless devices, displays, chip sets, set top boxes, games, and vehicles.

CONCLUSION

Embodiments of the present invention can include methods, memories and, systems, such as those that use cells coupled to the extra digit lines in fall size end arrays of open digit architectures as repair cells to repair faulty memory cells in core arrays.

The memories, which may be included in systems, include a memory block with an array of memory cells organized with digit lines and access lines and configured for an open digit architecture. The digit lines comprise groups of four adjacent digit lines. A first group of sense circuits are configured such that each sense circuit of the group corresponds to one group of the groups of four adjacent digit lines. Each group of four adjacent digit lines includes two lines configured for operable coupling to a second group of sense circuits and two lines operably coupled to the corresponding first group of sense circuits. Control logic in the memory is configured to activate an access line in the array. The access line is used to access a memory cell operably coupled to one or more of the two digit lines operably coupled to the two sense circuits of the second group of sense circuits. Alternatively, the access line is used to access a memory cell operably coupled to one or more of the two digit lines operably coupled to the corresponding sense circuit of the first group of sense circuits.

In other embodiments, the memory includes IO logic operably coupled to a data switch, the IO logic and data switch are configured for selecting an IO signal from the group of folded digit sense circuits rather than another IO signal from another array operably coupled to the data switch.

Methods of repairing a memory are disclosed. The methods may be to repair a memory including a first end array with a group of first sense circuits and a second end array with a group of second sense circuits wherein half the memory cells in the end arrays can be redundant. The memory also includes a plurality of core arrays and a plurality of open digit sense circuit groups operably coupled between the first end array, the plurality of core arrays, and the second end array. Other methods may be to repair a memory comprising a first half-bank and a second half-bank wherein each of the half banks include a first end array with a group of first folded digit sense circuit and a second end array with a group of second folded digit sense circuit wherein half the memory bits in the end arrays are redundant. A plurality of core arrays and a plurality of open digit sense circuit groups are operably coupled between the first end array, the plurality of core arrays, and the second end array.

The methods include activating a row in a core array that includes a replaceable IO and activating a row in a replacement array. The replacement array may be the first end array of the first half-bank, the second end array of the first half-bank, the first end array of the second half-bank, or the second end array of the second half-bank. The methods also include sensing the redundant memory in the replacement array to generate a replacement IO and selecting the replacement IO rather than the replaceable IO.

Although the present invention has been described with reference to particular embodiments, the present invention is not limited to these described embodiments. Rather, the present invention is limited only by the appended claims and their legal equivalents.

What is claimed is:

1. A memory, comprising:
an array of memory cells comprising digit lines and access lines and configured for an open digit architecture, wherein the digit lines comprise groups of four adjacent digit lines, wherein
each of the groups of digit lines comprises:
a first digit line operably coupled to a first open sense circuit;
a second digit line operably coupled to a second open sense circuit;
a third digit line operably coupled to a folded sense circuit; and
a fourth digit line operably coupled to the folded sense circuit; and
control logic configured to activate an access line in the array to access memory cells operably coupled to each of the first digit line, the second digit line, the third digit line, and the fourth digit line;
wherein the folded sense circuit is configured to sense a digit signal on one of the third and fourth digital lines and a complement digit signal on the other of the third and fourth digit lines substantially in parallel with the first open sense circuit configured to sense the first digit line and the second open sense circuit configured to sense the second digit line.

2. The memory of claim 1, wherein the first digit line and the second digit line alternate with the third digit line and the fourth digit line.

3. The memory of claim 1, wherein the third digit line and the fourth digit line.

4. The memory of claim 3, wherein the third digit line and the fourth digit line are in the center of the groups of four adjacent digit lines.

5. The memory of claim 1, further comprising:
a data switch configured for selecting an IO signal from the folded sense circuit rather than another IO signal from another group of sense circuits operably coupled to the data switch.

6. A memory, comprising:
a group of sense circuits;
a group of repair sense circuits, each repair sense circuit of the group comprising a first node and a second node and being configured to generate an IO signal;
an array of memory cells disposed between the group of repair sense circuits and the group of sense circuits, the array comprising:
  a first half of the cells operably coupled to the group of sense circuits; and
  a second half of the cells operably coupled to the group of repair sense circuits such that half of the second half of the cells operably couple to the first nodes of the group of repair sense circuits and another half of the second half of the cells operably couple to the second nodes of the group of repair sense circuits;
  wherein the group of sense circuits and the group of repair circuits are configured to operate concurrently to sense memory cells coupled thereto; and
IO logic operably coupled to a data switch, at least one of the IO logic and the data switch configured for selecting the IO signal.

7. The memory of claim 6, further comprising control logic configured to activate an access line in the array to access a cell in the first half of the cells or to access a cell in the second half of the cells.

8. The memory of claim 6, wherein the second half of the cells are operably coupled to adjacent pairs of digit lines, each of the pairs being separated by two digit lines operably coupled to cells of the first half of the cells.

9. The memory of claim 6, wherein digit lines coupled to cells of the first half of the cells alternate with digit lines coupled to cells of the second half of the cells.

10. A memory, comprising:
a first end array;
a second end array;
a third end array;
a fourth end array;
a first plurality of core arrays disposed between the first end array and the second end array;
a second plurality of core arrays disposed between the third end array and the fourth end array;
a first group of sense circuits, each sense circuit operably coupled to two digit lines of four adjacent digit lines in the first end array;
a second group of sense circuits, each sense circuit operably coupled to two digit lines of four adjacent digit lines in the second end array;
a third group of sense circuits, each sense circuit operably coupled to two digit lines of four adjacent digit lines in the third end array;
a fourth group of sense circuits, each sense circuit operably coupled to two digit lines of four adjacent digit lines in the fourth end array; and
control logic configured to:
  activate a first access line in the first end array to access the two digit lines in the first end array or access the other two digit lines of the four adjacent digit lines in the first end array;
  activate a second access line in the second end array to access the two digit lines in the second end array or access the other two digit lines of the four adjacent digit lines in the second end array;
  activate a third access line in the third end array to access the two digit lines in the third end array or access the other two digit lines of the four adjacent digit lines in the third end array; and
  activate a fourth access line in the fourth end array to access the two digit lines in the fourth end array or access the other two digit lines of the four adjacent digit lines in the fourth end array;
  wherein the first, second, third, and fourth groups of sense circuits are configured to sense a digit signal and a complement digital signal substantially in parallel with at least one of two open digit sense circuits coupled to the other of the two digit lines of the four adjacent digit lines.

11. The memory of claim 10, wherein the two digit lines alternate with the other two digit lines in each of the first group, the second group, the third group, and the fourth group.

12. The memory of claim 10, wherein the two digit lines in each of the first group, the second group, the third group, and the fourth group are adjacent.

13. The memory of claim 12, wherein the two digit lines in each of the first group, the second group, the third group, and the fourth group are in the center of the four adjacent digit lines.

14. The memory of claim 10, further comprising a data switch configured for selecting an IO signal from the first group of sense circuits, an IO signal from the second group of sense circuits, an IO signal from the third group of sense circuits, and an IO signal from the fourth group of sense circuits rather than one or more IO signals from other arrays operably coupled to the data switch.

15. A system, comprising:
at least one memory access device; and
at least one semiconductor memory operably coupled to the at least one memory access device and comprising:
  a first end array comprising first digit lines and configured for an open digit architecture;
  a second end array comprising second digit lines and configured for an open digit architecture;
  a plurality of core arrays disposed between the first end array and the second end array;
  a first plurality of folded digit sense circuits, wherein:
    first alternating digit lines are operably coupled to a first plurality of open digit sense circuits; and
    first other alternating digit lines are operably coupled to the first plurality of folded digit sense circuits;
  a second plurality of folded digit sense circuits, wherein:
    second alternating digit lines are operably coupled to a second plurality of open digit sense circuits; and
    second other alternating digit lines are operably coupled to the second plurality of folded digit sense circuits;
  control logic configured to:
    activate a first access line in the first end array to access the first alternating digit lines or the first other alternating digit lines; and
    activate a second access line in the second end array to access the second alternating digit lines or the second other alternating digit lines;
  wherein the first plurality of folded digit sense circuits and the second plurality of folded digit sense circuits are configured to sense the first plurality and the second plurality of the alternating digit lines coupled thereto substantially in parallel with the first plurality of open digit sense circuits and the second plurality of open digit sense circuits configured to sense the first plurality and the second plurality of the alternating digit lines coupled thereto.

16. The system of claim 15, further comprising a data switch configured for selecting an IO signal from the first plurality of folded digit sense amplifiers and an IO signal from the second plurality of folded digit sense amplifiers rather than one or more IO signals from other arrays operably coupled to the data switch.

17. A method of repairing a memory comprising a first end array with a group of first sense circuits wherein half the memory cells in the first end array can be redundant, a second end array with a group of second sense circuits wherein half the memory cells in the second end array can be redundant, a plurality of core arrays, a plurality of open digit sense circuit groups operably coupled between the first end array, the plurality of core arrays, and the second end array, the method comprising:
- activating a row in a core array of the plurality that includes a replaceable IO;
- activating a row in a replacement array selected from a group consisting of the first end array and the second end array to access redundant memory;
- sensing the redundant memory to generate a replacement IO; and
- selecting the replacement IO rather than the replaceable IO.

18. The method of claim 17, further comprising suppressing the activating a row in a core array.

19. The method of claim 17, further comprising:
- activating a row in an additional core array of the plurality that includes an additional replaceable IO; and
- activating a row in another of the replacement arrays to access additional redundant memory;
- sensing the additional redundant memory to generate an additional replacement IO; and
- selecting the additional replacement IO rather than the additional replaceable IO.

20. The method of claim 17, wherein when the core array with the activated row is adjacent to the replacement array, the activating a row in a replacement array further comprises activating a replacement array that is not adjacent to the core array with the activated row.

21. The method of claim 17, wherein when the core array with the activated row is one array away from a replacement array, the activating a row in a replacement array further comprises activating the replacement array that is more than one array away from the core array with the activated row.

22. The method of claim 17, wherein sensing the redundant memory to generate the replacement TO further comprises sensing the redundant memory with a group of sense amplifiers operably coupled to the redundant memory bits of the replacement array.

23. The method of claim 17, wherein the replaceable IO and the additional replaceable IO are determined after testing the memory.

24. A method of repairing a memory comprising a first half-bank and a second half-bank, each half-bank comprising a first end array with a group of first sense amplifiers wherein half the memory bits in the first end array are redundant, a second end array with a group of second sense amplifiers wherein half the memory bits in the second end array are redundant, a plurality of core arrays, a plurality of open digit sense amplifier groups operably coupled between the first end array, the plurality of core arrays, and the second end array, the method comprising:
- activating a row in a core array of the plurality that includes a replaceable IO;
- activating a row in a replacement array selected from the group consisting of the first end array of the first half-bank, the second end array of the first half-bank, the first end array of the second half-bank, and the second end array of the second half-bank to access redundant memory;
- sensing the redundant memory to generate a replacement IO; and
- selecting the replacement IO rather than the replaceable IO.

25. The method of claim 24, further comprising:
- activating a row in an additional core array of the plurality that includes an additional replaceable IO; and
- activating a row in another of the replacement arrays to access additional redundant memory;
- sensing the additional redundant memory to generate an additional replacement IO; and
- selecting the additional replacement IO rather than the additional replaceable IO.

26. The method of claim 24, wherein when the core array with the activated row is adjacent to a replacement array, the activating a row in a replacement array further comprises activating a replacement array that is not adjacent to the core array with the activated row.

27. The method of claim 24, further comprising:
- activating a row in each of the replacements arrays to generate four additional replacement IOs; and
- selecting the four additional replacement IO rather than IOs from the core array.

28. The method of claim 27, further comprising suppressing the activating a row in a core array.

29. The method of claim 25, wherein at least one of the replaceable IO and the additional replaceable IO are determined to be failed IOs after testing the memory.

* * * * *

UNITED STATES PATENT AND TRADEMARK OFFICE
CERTIFICATE OF CORRECTION

PATENT NO. : 8,351,285 B2
APPLICATION NO. : 12/497192
DATED : January 8, 2013
INVENTOR(S) : Michael S. Lane et al.

It is certified that error appears in the above-identified patent and that said Letters Patent is hereby corrected as shown below:

In column 14, line 64, in Claim 3, delete "line." and insert -- line are adjacent. --, therefor.

In column 17, line 53, in Claim 22, delete "TO" and insert -- IO --, therefor.

Signed and Sealed this
Second Day of April, 2013

Teresa Stanek Rea
*Acting Director of the United States Patent and Trademark Office*